United States Patent
Boppana et al.

(10) Patent No.: US 6,532,440 B1
(45) Date of Patent: Mar. 11, 2003

(54) MULTIPLE ERROR AND FAULT DIAGNOSIS BASED ON XLISTS

(75) Inventors: Vamsi Boppana, Santa Clara, CA (US); Rajarshi Mukherjee, Sunnyvale, CA (US); Jawahar Jain, Santa Clara, CA (US); Masahiro Fujita, Palo Alto, CA (US)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/173,962

(22) Filed: Oct. 16, 1998

(51) Int. Cl.[7] .............................................. G06F 17/50

(52) U.S. Cl. ............................ 703/14; 703/16; 716/3; 716/4; 714/42; 714/46

(58) Field of Search ............................. 703/14, 15, 16, 703/17; 714/724, 732, 42, 46; 324/76.11; 716/3, 4

(56) References Cited

U.S. PATENT DOCUMENTS

| | | | | |
|---|---|---|---|---|
| 5,406,502 A | * | 4/1995 | Haramaty et al. | 364/551.01 |
| 5,410,551 A | * | 4/1995 | Edwards et al. | 371/25.1 |
| 5,475,695 A | * | 12/1995 | Caywood et al. | 371/27 |
| 5,587,919 A | * | 12/1996 | Cheng et al. | 364/489 |
| 6,086,626 A | * | 7/2000 | Jain et al. | 716/5 |
| 6,132,109 A | * | 10/2000 | Gregory et al. | 395/704 |
| 6,202,181 B1 | * | 3/2001 | Ferguson et al. | 714/724 |
| 6,212,669 B1 | * | 4/2001 | Jain | 716/7 |
| 6,301,687 B1 | * | 10/2001 | Jain et al. | 716/3 |

OTHER PUBLICATIONS

M. Abramovici et al., "Faul Diagnosis in Synchronous Sequential Circuits Based on Effect–Cause Analysis," *IEEE Trans. Computers*, vol. C–31, No. 12, Dec. 1982, pp. 1165–1172.

M. Abramovici et al., "Multiple Fault Diagnosis in Combinational Circuits Based on an Effect–Cause Analysis," *IEEE Trans. Computers*, vol. C–29, No. 6, Jun. 1980, pp. 451–460.

R.C. Aitken et al., "Better Models or Better Algorithms? Techniques to Improve Fault Diagnosis," *Hewlett–Packard Journal*, Feb. 1995, pp. 110–116.

R.C. Aitken, "Finding Defects with Fault Models," in *Proc. Intl. Test Conf.*, Paper 22.3, Oct. 1995, pp. 498–505.

S.B. Akers et al., Why is less information from logic simulation more useful in fault simulation?, in *Proc. Intl. Test Conf.*, Paper 35.1, Sep. 1990, pp. 786–800.

(List continued on next page.)

*Primary Examiner*—Kevin J. Teska
*Assistant Examiner*—Thai Phan
(74) *Attorney, Agent, or Firm*—Christie, Parker & Hale, LLP

(57) ABSTRACT

A method and system for locating possible error or fault sites in a circuit or system. A set of nodes are chosen, using error models in some embodiments. By applying X values to the set of nodes in conjunction with three valued logic simulation output responses between the circuit and the specification are determined. Based on the comparison of the output responses between the circuit and the specification, an error probability can be assigned to the set of nodes. A ranked set of nodes is thereby produced with the highest ranked set of nodes being the most likely error or fault site.

Furthermore, by determining the relationship of the inputs to the set of nodes to the outputs of the set of nodes in conjunction with test vectors and output responses determined in the specification, an error probability can also be assigned to the set of nodes. Use of symbolic logic variables can assist in determining the relationship of the inputs to the set of nodes to the outputs of the set of nodes.

14 Claims, 14 Drawing Sheets

OTHER PUBLICATIONS

S. Chakravarty et al., "Algorithms for Current Monitoring Based Diagnosis of Bridging and Leakage Faults," in *Proc. Design Automation Conf.*, Paper 22.6, Jun. 1992, pp. 353–356.

S. Chakravarty et al., "An Algorithm for Diagnosing Two–Line Bridging Faults in Combinational Circuits," in *Proc. Design Automation Conf.*, Jun. 1993, pp. 520–524.

B. Chess et al., "Diagnosis of Realistic Bridging Faults with Single Stuck–at Information," in *Proc. Intl. Conf. Computer–Aided Design*, Nov. 1995, pp. 185–192.

P.Y. Chung et al., "ACCORD: Automatic Catching and CORrection of Logic Design Errors in Combinational Circuits", in Proc. Intl. Test Conf., Paper 35.2, Sep. 1992, pp. 742–751.

P.Y. Chung et al., "Diagnosis and Correction of Logic Design Errors in Digital Circuits", in *Proc. Design Automation Conf.*, Jun. 1993, pp. 503–508.

H. Cox et al., "A Method of Fault Analysis for Test Generation and Fault Diagnosis", *IEEE Trans. on Computer–Aided Design*, vol. 7, No. 7, Jul. 1988, pp. 813–833.

K. De et al., "Failure Analysis for Full–Scan Circuits," in *Proc. Intl. Test Conf.*, Paper 27.3, Oct. 1995, pp. 636–645.

A. Kuehlmann et al., "Error Diagnosis for Transistor–Level Verification", in *Proc. Design Automation Conf.*, Jun. 1994, pp. 218–224.

S.Y. Kuo, "Locating Logic Design Errors via Test Generation and Don't–Care Propagation", in *Proc. European Design Automation Conf.*, 1992, pp. 466–471.

D.B. Lavo et al., "Beyond the Byzantine Generals: Unexpected Behavior and Bridging Fault Diagnosis," in *Proc. Intl. Test Conf.*, Paper 23.1, Oct. 1996, pp. 611–619.

H.T. Liaw et al., "Efficient Automatic Diagnosis of Digital Circuits", in *Proc. Intl. Conf. Computer–Aided Design*, Nov. 1990, pp. 464–467.

S.D. Millman et al., "Diagnosing CMOS Bridging Faults with Stuck–at Fault Dictionaries," in *Proc. Intl. Test Conf.*, Paper 37.3, Oct. 1990, pp. 860–870.

T. Niermann et al., "HITEC: A test generation package for sequential circuits," in *Proc. European Design Automation Conf.*, Feb. 1991, pp. 214–218.

I. Pomeranz et al., "On Diagnosis and Correction of Design Errors", in *Proc. Intl. Conf. Computer–Aided Design*, Nov. 1993, pp. 500–507.

I. Pomeranz et al., "On Error Correction in Macro–Based Circuits", in *Proc. Intl. Conf. Computer–Aided Design*, Nov. 1994, pp. 568–575.

I. Pomeranz et al., "On the Generation of Small Dictionaries for Fault Location," in Proc. Intl. Conf. Computer–Aided Design, Nov. 1992, pp. 272–279.

V. Ratford et al., "Integrating Guided Probe and Fault Dictionary: An Enhanced Diagnostic Approach," in *Proc. Intl. Test Conf.*, Paper 10.3, Sep. 1986, pp. 304–311.

J. Richman et al., "The Modern Fault Dictionary," in *Proc. Intl. Test Conf.*, Paper 19.2, Sep. 1985, pp. 696–702.

E.M. Rudnick et al., "Diagnostic Fault Simulation of Sequential Circuits," in *Proc. Intl. Test Conf.*, Paper 7.1, Oct. 1992, pp. 178–186.

P.G. Ryan, "Compressed and Dynamic Fault Dictionaries for Fault Isolation," Tech. Rep. UILU–ENG–94–2234, Center for Reliable and High–Performance Computing, University of Illinois at Urbana–Champaign, Sep. 1994, 68 pages.

P.G. Ryan et al., "Fault Dictionary Compression and Equivalence Class Computation for Sequential Circuits", in *Proc. Intl. Conf. Computer–Aided Design*, Nov. 1993, pp. 508–511.

P. Ryan et al., "Two Stage Fault Location," in *Proc. Intl. Test Conf.*, Paper 35.3, Oct. 1991, pp. 963–968.

K.A. Tamura, "Locating Functional Errors in Logic Circuits", in *Proc. Design Automation Conf.*, Paper 12.3, Jun., 1989, pp. 185–191.

M. Tomita et al., "An Algorithm for Locating Logic Design Errors", in *Proc. Intl. Conf. Computer–Aided Design*, Nov. 1990, pp. 468–471.

M. Tomita et al., "Rectification of Multiple Logic Design Errors in Multiple Output Circuits", in *Proc. Design Automation Conf.*, Jun. 1994, pp. 212–217.

R.E. Tulloss, "Fault Dictionary Compression: Recognizing when a Fault may be Unambiguously Represented by a Single Failure Detection," in *Proc. Intl. Test. Conf.*, Paper 14.3, Nov. 1980, pp. 368–370.

R.E. Tulloss, "Size Optimization of Fault Dictionaries," in Proc. Intl. Test Conf., Nov. 1978, pp. 264–265.

S. Venkataraman et al., "Dynamic Diagnosis of Sequential Circuits Based on Stuck–at Faults," in *Proc. VLSI Test Symp.*, Apr. 1996, pp. 198–203.

S. Venkataraman et al., "Rapid Diagnostic Fault Simulation of Stuck–at Faults in Sequential Circuits using Compact Lists," in Proc. Design Automation Conf., Jun. 1995, pp. 133–138.

J.A. Waicukauski et al., "Failure Diagnosis of Structured VLSI," *IEEE Design & Test of Computers*, Aug. 1989, pp. 49–60.

J.A. Waicukauski et al., "Fault Simulation for Structured VLSI," *VLSI Systems Design*, vol. VI, No. 12, Dec. 1985, 6 pages.

* cited by examiner

GOOD CIRCUIT

FAULTY CIRCUIT

MULTIPLE ERROR AND FAULT DIAGNOSIS BASED ON XLISTS

BACKGROUND OF THE INVENTION

The present invention relates generally to the field of Computer-Aided Design (CAD) systems and methods, and in particular, to CAD systems and methods for digital circuit verification and testing.

Computer-aided design of digital circuits and other complex digital systems is widely prevalent. The requirements of the circuit or system are defined in an abstract model of the circuit or system. The abstract model is then successfully transformed into a number of intermediate stages. These intermediate stages often include a register transfer level model which represents a block structure behavioral design, and a structural model which is a logic level description of the system. Eventually, a transistor net list and consequently the physical layout of the circuit or system are derived.

The design of the circuit or system therefore proceeds from the general requirements level to the lower detailed level of the physical design interposed between are a number of intermediate levels. Each successive level of the design is tested or verified to insure that the circuit or system continues to meet the design specifications.

If the design verification step fails, a diagnosis is typically invoked to determine possible causes for the failure. During the design phase, prior to actual physical implementation of the circuit the diagnosis is generally termed error diagnosis. After physical implementation of the circuit, the diagnosis is generally termed fault diagnosis. Such diagnosis, whether error diagnosis or fault diagnosis, provides valuable feedback to designers and process engineers. The diagnosis can identify potential error sites in the design or circuit. This is helpful because a particular design or circuit may contain numerous elements and the verification stage may provide little or no information as to which elements may require adjustment to achieve proper behavior. Providing a limited set of candidates where correction could be performed accordingly may significantly decrease the time and difficulty of correcting design or circuit operation.

Conventionally, error diagnosis has primarily focused on diagnosing single errors. Furthermore, error diagnosis methods are often limited as to the types of errors which may be located. Therefore, these error diagnosis methods are limited in scope. In addition, extending these error diagnosis methods to diagnosis multiple errors generally results in erroneous error locations or requires excessive amounts of time to perform error location.

As previously alluded, fault diagnosis is the process of locating failures in the digital circuit at the fabrication stage of the design flow. Fault diagnosis examines a specific part of a digital circuit to determine causes of failure in the circuit. Manufacturing errors or fabrication defects, such as shorts caused by dust particles introduced into the silicon of an integrated circuit, improper soldering, or incorrect wiring, are examples of faults.

Current methods of fault diagnosis have similar limitations as methods of error diagnosis. These methods identify a single fault or error, but fail to accurately identify multiple faults or errors. The ability of the diagnosis to handle multiple errors or faults, however, has become increasingly important as digital circuits have become more complicated.

SUMMARY OF THE INVENTION

The present invention provides a method and system for determining potential locations of errors or faults in a circuit design. The errors or faults results in the output behavior of the circuit design not matching the output behavior of a circuit specification when a predetermined test vector is applied to both the circuit design and the circuit specification. In one embodiment, a list of candidate nodes is created, the list comprised of nodes in the circuit design. A test vector is applied to the circuit design and the candidate nodes are set to an X value. The X value is a logic value of a 0, 1, X three value logic system. The output behavior of the circuit design upon application of the test vector, with the candidate nodes set to X, is determined. An error probability is assigned to the list of candidate nodes depending on whether the output behavior of the circuit design changes as a result of setting the candidate nodes to X. The error probability is increased if the output behavior changes and the error probability decreases if the output behavior does not change.

A list of further candidate nodes is also created, and the test vector is applied to the circuit design, and the further candidate nodes are set to X. The output behavior of the circuit design is again determined and an error probability is assigned to the further candidate of nodes. The process is repeated for lists of other candidate nodes and other test vectors, with the output behavior of the circuit design determined and error probabilities assigned. In various embodiments of the present invention, output behavior comparison is between various combinations of a circuit design, a physical circuit, and a circuit specification.

In some embodiments, the candidate nodes are determined using error models, including a region-based model, a topological based model, a cut based model, and a register transfer level based model. Levels of confidence in the models to identify the errors or faults in the circuit are used in the assignment of error probabilities. In conjunction with error or fault models, the method and system guarantees in instances that the errors.or faults are entirely at a set of nodes when the model exactly covers the errors or faults.

In one embodiment of the present invention provides that the candidate nodes have inputs and outputs, with at least some of the inputs being determined by the test vector and at least some of the primary outputs having values dependent on the values of at least some of the outputs. The required values of the outputs to obtain output behavior of the circuit design matching output behavior of the circuit specification is determined. A relationship between the at least some of the inputs and the at least some of the outputs is determined, with the relationship resulting in the at least some of the outputs having the required values upon application of the test vector.

A further test vector is applied to the circuit design and further required values of the outputs to obtain output behavior of the circuit design matching output behavior of the circuit specification is determined. A further relationship between the at least some of the inputs and the at least some of the outputs is determined, with the further relationship resulting in the at least some of the outputs having the further required values upon application of the further test vector. An error probability is assigned to the list of candidate nodes. The error probability depends on the consistency of the relationship between the at least some of the inputs and the at least some of the outputs upon application of the test vector and the further test vector.

The process is repeated for other test vectors and lists of other candidate nodes with the relationship between the at least some of the inputs and the at least some of the outputs upon application of the test vectors determined and the error probability assigned. Furthermore, the use of symbolic logic variables and binary decision diagrams are used to determine required values for the at least some of the outputs.

These and other features of the present invention will be more readily appreciated as the same becomes better understood by reference to the following detailed description when considered in connection with the accompanying drawings.

DETAILED DESCRIPTION

I. Overview

The present invention comprises a method and system for locating possible error or fault sites in a circuit or system, and particularly for locating possible areas containing multiple design errors or faults. The method produces a ranked set of nodes, with the highest ranked nodes or sets of nodes being the most likely sites of errors or faults. The method and system use a three valued logic simulation or symbolic logic simulation to analyze all possible errors or faults at a set of nodes. In conjunction with error or fault models, the method and system can guarantee that the errors or faults at a set of nodes are identified when the model exactly covers the errors or faults. The method and system uses an identified set of candidate nodes that are analyzed for all possible errors or faults. The results provided by the method and system provide valuable feedback to designers about potential error or fault sites, and can be used in conjunction with a correction tool to provide automatic circuit correction. The feedback provides a limited set of candidates where correction could be performed to ensure that the behavior of the implementation matches that of the specification.

A. Xlist Based Analysis

A Xlist based analysis determines whether a set of nodes, called a Xlist, can produce erroneous behavior, whether the erroneous behavior is due to an error or fault. A Xlist is a set of nodes whose actual values are replaced during simulation by an X value. The set of nodes do not need to be in a contiguous region on the circuit, but maybe scattered throughout the circuit. X values are one state of a three state logic system, with the other states being 0 and 1. The X values are non-enumerated. Therefore, no conclusion need to be made concerning the result of a logic operation evaluating X values from diverse sources. The X values could be enumerated, although this would increase the complexity of the analysis and thus is not preferred. During system simulation the X values are propagated to subsequent nodes by use of a three value logic simulation. Three value logic simulation refers to propagating signals having logic values 0, 1, or X through the system, whether a specification, design, or circuit to primary outputs of the specification, design or circuit.

Figure 1:
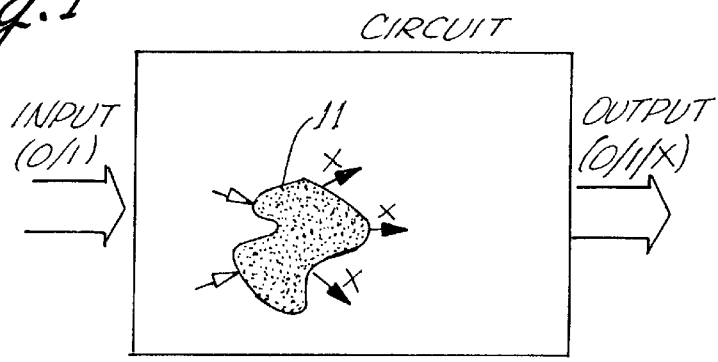
FIG. 1 illustrates an abstract model of a circuit with an Xlist.

FIG. 1 illustrates a design representation containing a region, or set of nodes, identified by an Xlist. The design representation has a number of primary inputs 13 which may be set to either zero or one. Region 11 of the circuit comprises an Xlist region with every node in the region a member of the Xlist. The outputs of the shaded region are all set to X. Accordingly, outputs 15 of the circuit may take the values 0, 1, or X.

Primary inputs of the circuit, outputs from the same or other Xlists, or from all three sources can provide the inputs to the Xlist. Outputs from the Xlist can supply inputs to the primary outputs of the circuit, the inputs of the same or other Xlists, or all three destinations.

Circuit designs are often tested by applying a set of values, termed a test vector, to the primary inputs of the design. Each test vector is associated with an expected response at the primary outputs. If the actual response at the primary outputs does not match the expected response then the design does not match the specification for the design.

A test vector presented at the primary inputs of the circuit containing a region defined by an Xlist produces a primary output response which provides information regarding possible error locations. If the output response of the circuit containing an Xlist, a set of nodes, is opposite of that of expected output response, then the Xlist does not contain any of the errors or faults expressed by the test vector. If the output response of the circuit containing an Xlist is X, then the Xlist may contain errors or faults. This is because the combination of signal values on the nodes are covered by the X values.

Furthermore, if there are two Xlists chosen, Xlist1 and Xlist2, and every path from Xlist1 to a primary output of the circuit has to go through Xlist2, then Xlist1 is in the dominance region of Xlist2. The dominance region of one Xlist to another Xlist provides that the dominant Xlist will capture the behavior of any error in the subservient Xlist.

For example, for Xlist2 dominant to Xlist1, any errors in Xlist1 will be captured in Xlist2. Therefore, by testing for errors within Xlist2 will necessarily test for errors within Xlist1.

Therefore, from the use of the Xlists, important diagnostic inferences can be drawn regarding possible error or fault locations and locations which can not contain errors or faults expressed by a particular test vector. Accordingly, to the extent a suite of test vectors covers a design or circuit, information can be obtained regarding portions of the design or circuit that are free of errors or faults and portions of the design or circuit which may contain errors or faults. For convenience, hereinafter the terms fault and error will be used interchangeably.

1. Error Analysis Example

In FIGS. 2a–d, an example of a design and Xlists are illustrated to aid in the understanding of diagnostic inferences that can be drawn from the use of Xlists. FIGS. 2a–d illustrate four simulations.

Figure 2A:
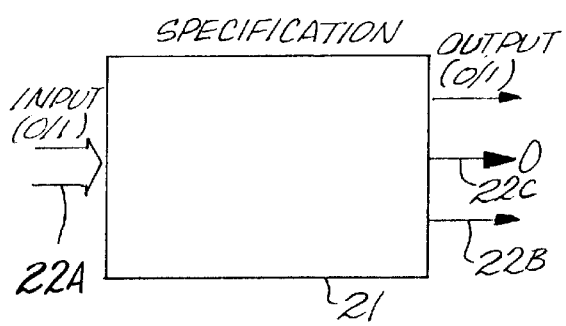
FIG. 2A illustrates an abstract model of a circuit containing no faults or errors.

The simulation of FIG. 2a is that of a specification 21 which provides expected behavior of primary outputs 22b when primary inputs 22a are set to specified values. As illustrated, a second primary output 22c is expected to be a logic 0 when the primary inputs are provided a specific test vector.

Figure 2B:
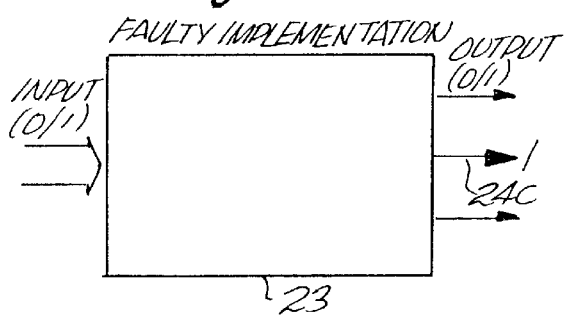
FIG. 2B illustrates an abstract model of a circuit containing errors.

The simulation illustrated in FIG. 2B is that of a faulty implementation, or design, of the specification illustrated in FIG. 2A. In the faulty implementation of FIG. 2B, a second output 24C is a logic 1 when the primary inputs are provided the specific test vector. Accordingly, the faulty implementation of FIG. 2B contains at least one error.

Figure 2C:
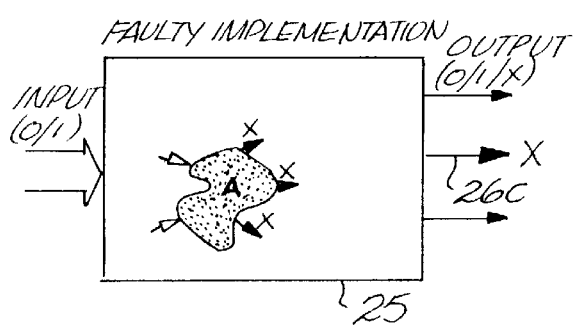
FIG. 2C illustrates an abstract model of a circuit containing errors and using an Xlist A.

The simulation of FIG. 2C is that of the faulty implementation of FIG. 2B containing a set of nodes identified by an Xlist. Due to the influence of the set of nodes identified by the Xlist A, the second primary output 26C is a logic X when the primary inputs are provided the specific test vector.

Figure 2D:
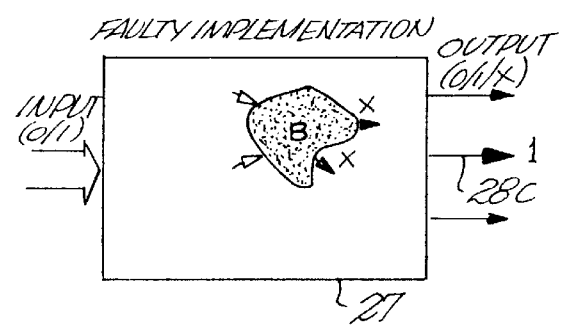
FIG. 2D illustrates an abstract model of a circuit containing errors and using an Xlist B.

FIG. 2D illustrates a simulation of the faulty implementation of FIG. 2B, with the faulty implementation containing a second set of nodes identified by a second Xlist B. The second primary output 28C of the faulty implementation is set to a logic 1 when the primary inputs are provided the specific test vector.

Since the second primary output of both the faulty implementation 23 and the faulty implementation containing the Xlist B are equal, no combination of multiple errors consisting entirely of the nodes in the region B can account for errors in the circuit. If errors were at the nodes in the Xlist B region, changing the nodes in the region to X values would cause the simulation to propagate an X value to the second primary output. Therefore, the simulation 27 of the faulty implementation provides information that the nodes in the Xlist B cannot account for errors identified using the specified test vector. Furthermore, the simulation of the faulty implementation using the Xlist A suggests that the nodes in the Xlist A region may account for the error identifiable by the specified test vector.

By the same reasoning, comparison of the second primary output of the specification simulation 21 and the faulty implementation using Xlist B simulation 27 can also be performed to determine if an error is not within Xlist B. If the second primary outputs of the specification simulation 21 and the Xlist B simulation 27 are not equal, no combination of multiple errors consisting entirely of the nodes in the region B can account for the error in the circuit. This reasoning can also be extended to comparison of primary outputs of the faulty simulation 23 to a specification simulation influenced by Xlists. In this case, if the primary outputs of the faulty simulation 23 and specification simulation influenced by an Xlist are not equal, no combination of multiple errors consisting entirely of the nodes in the Xlist can account for the error in the circuit. However, instead of trying to make the faulty circuit to conform to the specification, the specification is being manipulated to conform to the faulty circuit.

2. Fault Analysis Example

Figure 3:
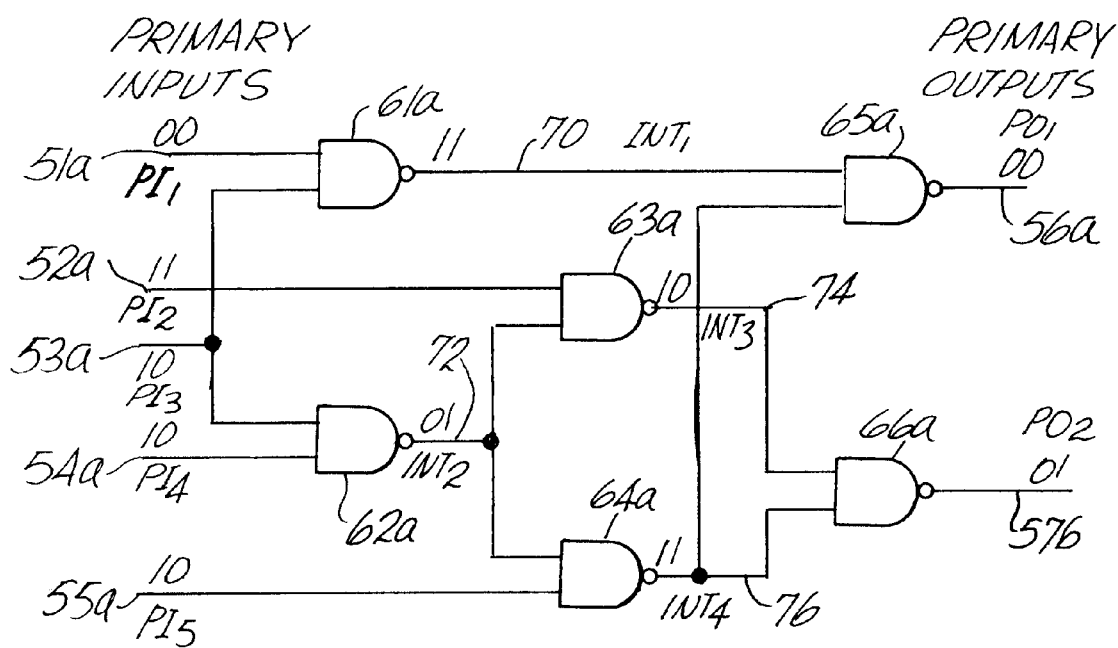
FIG. 3 illustrates an example circuit containing no faults or errors.

FIG. 3 illustrates a circuit design. The circuit has first through fifth primary inputs 51a–55a, denoted as $PI_1$–$PI_5$, and first and second primary outputs 56a, 57b, denoted as $PO_1$ and $PO_2$. First through sixth NAND gates 61a–66a are between the primary inputs and the primary outputs. The first NAND gate receives as inputs the first and third inputs, $PI_1$, and $PI_3$, and has a first intermediate signal 70, $Int_1$, as an output. The second NAND gate has the third and fourth primary inputs, $PI_3$ and $PI_4$, as inputs, and has a second intermediate signal 72, $Int_2$, as an output. The third NAND gate has as inputs the second primary input, $PI_2$, and the second intermediate signal, $Int_2$, and has a third intermediate signal 74, $Int_3$, as an output. The fourth NAND gate has as inputs the fifth primary input, $PI_5$, and the second intermediate signal, $Int_2$, and has a fourth intermediate signal 76, $Int_4$, as an output. The fifth NAND gate has the first and fourth intermediate signals, $Int_1$ and $Int_4$, as inputs and the first primary output, $PO_1$, as an output. The sixth NAND gate has the third and fourth intermediate signals, $Int_3$ and $Int_4$, as inputs and the second primary output, $PO_2$, as an output.

Figure 4:
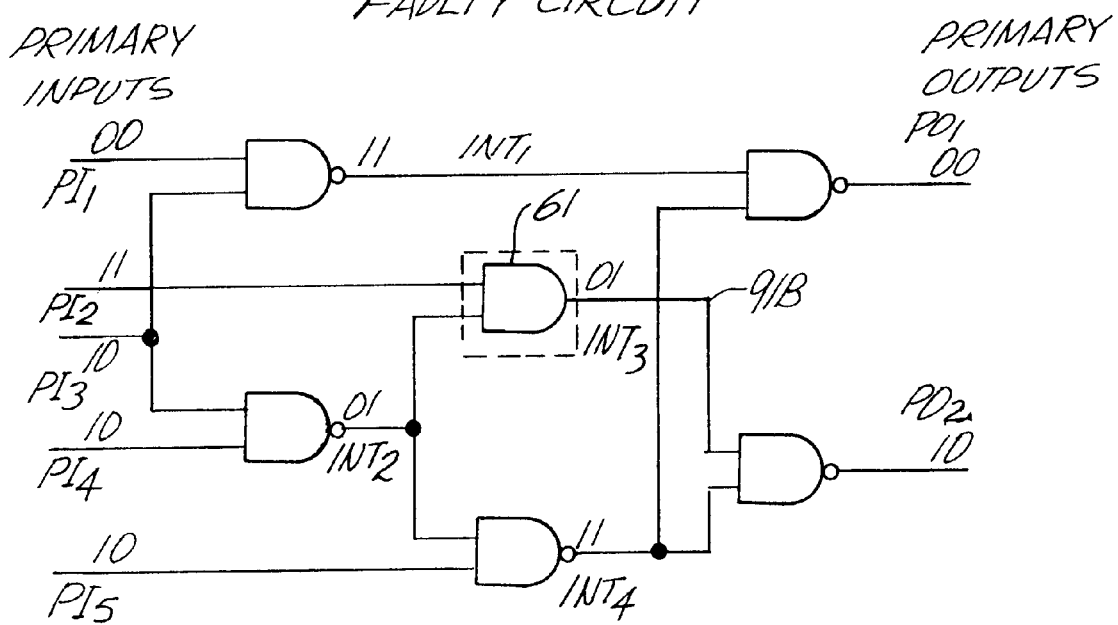
FIG. 4 illustrates an example circuit containing a fault.

FIG. 4 illustrates an implementation of the circuit design of FIG. 3, but with a fault. In the implementation of FIG. 4, the third NAND gate is, due to the fault, instead an AND gate 61. In all other respects the circuit design of FIG. 3 and the circuit implementation of FIG. 4 are identical.

To illustrate the present invention, two test vectors are introduced at the primary inputs of the design and the implementation. Application of the test vectors results in propagation of signals through the design and the implementation. The first test vector is 01111. In other words, $PI_1$ is set to 0, $PI_2$ is set to 1, $PI_3$ is set to 1, $PI_4$ is set to 1 and $PI_5$ is set to 1. Application of the first test vector results in node 74, at the output of the third NAND gate 63a, being set to a logic 1. Application of the first test vector also results in $Int_1$, being set to 1, $Int_2$ being set to 0, and $Int_4$ being set to 1. Accordingly, the first primary output $PO_1$ is set to 0, and the second primary output $PO_2$ is set to 0.

Application of the first test vector to the implementation of FIG. 4, however, results in a different response at the primary outputs. Application of the first test vector results in node 91b, at the output of the AND gate 61, being set to 0 instead of 1, with the result that the first primary output $PO_1$ is set to 0, and the second primary output $PO_2$ is set to 1.

Similarly, application of a second test vector, 01000, to the primary inputs of the design and the implementation also produces differing results in the behavior of the primary outputs. Application of the second test vector to the design results in the first primary output being set to 0 and the second primary output being set to 1. In the implementation, however, application of the second test vector results in the first primary output being set to 0 and the second primary output also being set to 0.

With the signal at node 91B is stuck at an unknown, i.e. X value, all possible erroneous behaviors at node 91B are captured. When either the first or second test vector is presented to the faulty circuit and the signal at node 91B stuck at a X value, the first primary output $PO_1$ is a logic 0 and the second primary output $PO_2$ is X. Therefore, all logic value combinations including possible erroneous combinations of the primary outputs PO$_1$ and PO$_2$ are captured by the X value at node 91B.

By way of comparison, some conventional fault diagnosis methods examine responses of a circuit when a single node is stuck at 0 (s-a-0) or stuck at 1 (s-a-1). In other words, the signal at node 91B is set, or stuck at, a fixed logic value of 1 or 0.

With the signal at node 91B stuck at a logic 0, the first primary output PO$_1$ is a logic 0 and the second primary output PO$_2$ is a logic 1 when both test vectors 01111 and 01000 are presented to the primary inputs of the faulty circuit of FIG. 4. Alternatively, with the signal at node 91B stuck at logic 1, the primary outputs PO$_1$ and PO$_2$ are both logic 0 when either of the two test vectors 01111 and 01000 are presented to the primary inputs of the faulty circuit of FIG. 4.

The stuck at zero fault model fails to capture the second primary output PO$_2$ set to a logic 0 when the second test vector 01000 is presented to the faulty circuit. Conversely, the stuck at one fault model fails to capture the second primary output PO$_2$ set to a logic 1 when the first test vector 01111 is presented to the faulty circuit. Accordingly, all possible erroneous behaviors at node 91B are not covered by either the stuck-at-one or stuck-at-zero fault diagnosis methods.

Table I summarizes the responses of the example circuits of FIG. 3 and 4 to the different fault diagnoses. Table I includes the primary output responses produced by the good circuit, the faulty circuit, the faulty circuit with the stuck at 0 fault model for node 91B, the faulty circuit with the stuck at 1 fault model for node 91B, and the faulty circuit with the Xlist. The Xlist analysis technique performs equally well with errors or faults within the digital circuit.

TABLE I

|  | Good Circuit Response | Faulty Circuit Response | Stuck At Zero Response | Stuck At One Response | Xlist Response |
| --- | --- | --- | --- | --- | --- |
| Test Vector 1 (Primary Output 1) | 0 | 0 | 0 | 0 | 0 |
| Test Vector 1 (Primary Output 2) | 0 | 1 | 1 | 0 | x |
| Test Vector 2 (Primary Output 1) | 0 | 0 | 0 | 0 | 0 |
| Test Vector 2 (Primary Output 2) | 1 | 0 | 1 | 0 | x |

B. Error or Fault Models

The powerful diagnostic inferences produced by the use of Xlists are further bolstered by the use of error or fault models. Through the use of error or fault models, improved results regarding identifying error location in a circuit can be obtained. Error models are used to select nodes for inclusion in two examples of error models are a topological error model and a region based error model. A topological error model is based on topological sorting of the nodes in the circuit. A region based error model is based on gates within a fixed fan in region around a node.

For a topologically bounded error T is a topological order specified on the nodes of the circuit, T=(t$_1$, t$_2$, . . . t$_n$).

An error is called a topologically bounded error if the logic functions at the nodes in the set E are erroneous and the nodes satisfy the following:

$E=(e_1, e_2, \ldots, e_k)$ and $\exists i, j, (1 \leq i \leq j \leq n)$ such that $\{i \leq e_l \leq j, \forall l | 1 \leq l \leq k\}$.

The integers i, j are the lower and upper bounds within which the error lies and j−i+1 is called the bound on the error.

A region based error is an error if the logic functions at the nodes are incorrect and the error is within a structural distance of radius R of the nodes in the circuit. In this model, regions are defined in the circuit that consist of nodes that are located "near" each other based on the structural distance between the nodes.

An error is called a region-based error of radius r if the logic functions at the nodes in the set E are erroneous and the nodes satisfy the following:

$E=(e_1, e_2, \ldots, e_k)$ and $\exists p, 1 \leq p \leq n$ such that

Structural Distance$(e_1, p) \leq r$

Other examples of error models are a cut based error model and a register transfer level (RTL) based error model.

A RTL based error is an error if the logic functions at the nodes are incorrect and the error lies in a lower level module of a higher level module of a circuit in a hierarchical design.

A cut based error is an error if the logic functions at the nodes are incorrect and the error lies within a fixed subset of nodes in the circuit to form a cut region in the circuit. The cut region is a region in which a signal from any primary input of the circuit must pass through the cut region to reach any primary output of the circuit.

Either the region based error model, the topological error model, the cut based error model, or the RTL based error model may be used to develop Xlists. As is discussed below, a determination of a set of nodes containing all of the error locations is possible if the error under diagnosis is of the type of error represented by the error model.

Further, even if the error under diagnosis is not of the type of error represented by the error model useful information may still be provided using the Xlist diagnostic approach.

II. Diagnosis

As previously described, the analysis technique works well for error diagnosis as well as for fault diagnosis. The essential diagnostic methods are not different. However, the invocation of the error diagnosis and the fault diagnosis at different stages of the design flow can add some subtle differences to the diagnostic process.

Table II provides a process for performing an error location diagnosis. The process is provided a plurality of Xlists and test vectors. The process provides a score for each Xlist indicating the likelihood of the Xlist containing all of the errors associated with a test vector, and drops Xlists from consideration if score indicates an Xlist is unlikely to contain all of the errors.

TABLE II

```
// Each L is an Xlist of nodes
// MATCHCOUNT, PARTIALMATCHCOUNT, MISMATCHPENALTY
// and DROPTHRESHOLD are input parameters
// Match means a (0,0) or (1,1) combination
// Mismatch means a (0,1) or (1,0) combination
// Partialmatch means a (0,X) or (1,X) combination
for each Vector
// Let CurrVec be the current vector
    for each Xlist L do
        if (Score[L]>DROPTHRESHOLD) do
            for each primary output do
                // Let CurrPo be the current primary output
                if (Match (Response(CurrVec, CurrPo),
                    FaultyResponse(L, CurrVec, CurrPo)==MATCH))
                    Score[L]+=MATCHCOUNT;
                elseif (Match (Response (CurrVec, CurrPo),
                    FaultyResponse(L,CurrVec, CurrPo)==PARTIALMATCH))
                    Score[L]+=PARTIALMATCHCOUNT;
                else // MISMATCH
                    Score[L]-=MISMATCHPENALTY;
                endif
            endfor
        endif
    endfor
endfor
end
```

A. Error Diagnosis

Error diagnosis is invoked when there is an error in a design of a circuit, the design being at a stage in the design flow where the circuit has not actually been fabricated or manufactured. Therefore, the error is determined by comparing the primary output responses of a specification specifying the requirements of a circuit to the primary output response of a computer-representation, or design, of the circuit. The specification is usually a document created by a designer describing the expected responses of the primary outputs of the specification circuit. The specification is not limited to a document, but it maybe a circuit-representation in the form of a C language program, a hardware description language, or other similar forms. The specification in any form describes the expected responses of the specification circuit.

The computer-representation of the circuit is a computer model describing the circuit by using a hardware description language or by another similar means. The responses of the primary outputs of the computer-model circuit are determined by a simulation tool stimulating the primary inputs of the computer-model circuit, propagating logic values through the circuit, and examining the primary outputs of the circuit. Simulation tools are well known in the art and any simulation tool capable of handling three-valued or symbolic logic works with the process. The simulation tool can determine the logic values throughout the circuit over a time period that may or may not be specified by a clock. The simulation tool also provides the replacement of values at nodes to an X value. Therefore, comparison of the primary outputs of the specification and the computer-representation circuit under the influence of an Xlist is easily implemented in a computer.

In one embodiment, the primary outputs are examined in a pseudo-parallel fashion, with the primary outputs processed thirty two at a time. Of course, if processing of up to thirty two outputs results in examination of all the primary outputs, then this portion of the process would be fully parallel.

Figure 5:
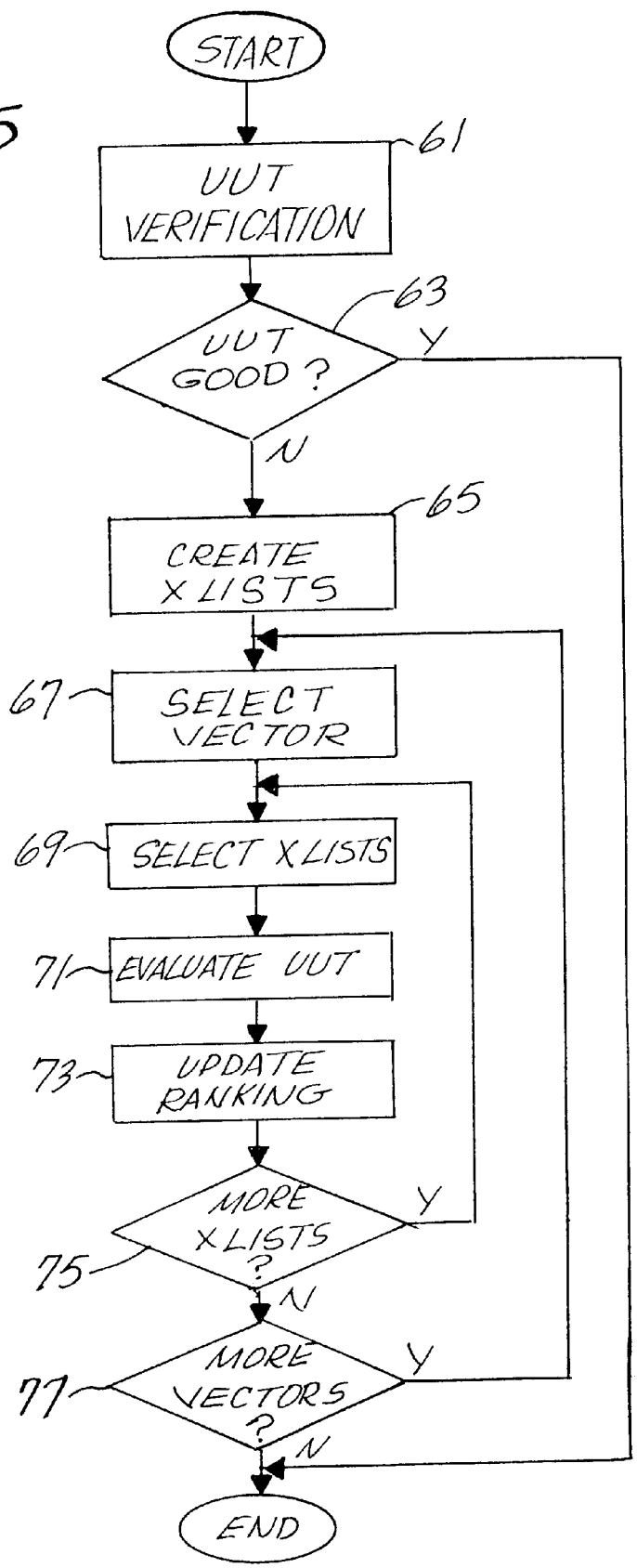
FIG. 5 illustrates a flow diagram of an overview of the error/fault diagnosis using Xlists.

FIG. 5 illustrates a flow diagram of a process for locating multiple design errors or faults using Xlists. A circuit or a design is subjected to verification in step 61. The verification may be performed using automatic test program tools, or formal verification techniques. In step 63, the process determines if the unit under test has successfully been verified. If the unit under test successfully passes the test of verification step then the process ends. If, however, the unit under contains one or more faults or errors then the process continues to step 65 in which Xlists are created. The Xlists may be created using a topological error model, a region error model, or some other technique. In step 67, the process selects a test vector, assuming that a suite of tests vectors already exists. If a suite of test vectors is not available then such a suite would need to be created. In step 69, the process selects an Xlist. In step 71, the process evaluates the unit under test utilizing the Xlist selected in step 69. If the unit under test is a physical circuit, then the Xlist will necessarily need to be applied to a representation of the circuit. This will be more thoroughly described with respect to FIG. 6, the evaluation step involves application of a test vector to the circuit or design and application of the test vector to the design to which an Xlist is applied. After application of the test vector the primary outputs of the two entities are compared.

After evaluating the unit under test in step 71, the process updates the relative ranking of the Xlist in step 73. The Xlist most likely to contain all of the errors in a given design circuit is ranked highest, and the Xlist least likely to contain all of the errors in the circuit is ranked lowest. In step 75, the process determines if all of the Xlists have been used with respect to a test vector. If more Xlists remain for evaluation the process returns to step 69. If no additional Xlists remain for evaluation with respect to a specific test vector the process determines if all of the test vectors in the suite of test vectors have been used for evaluation. If additional vectors remain for testing the process returns to step 67. Otherwise the process ends.

Figure 6:
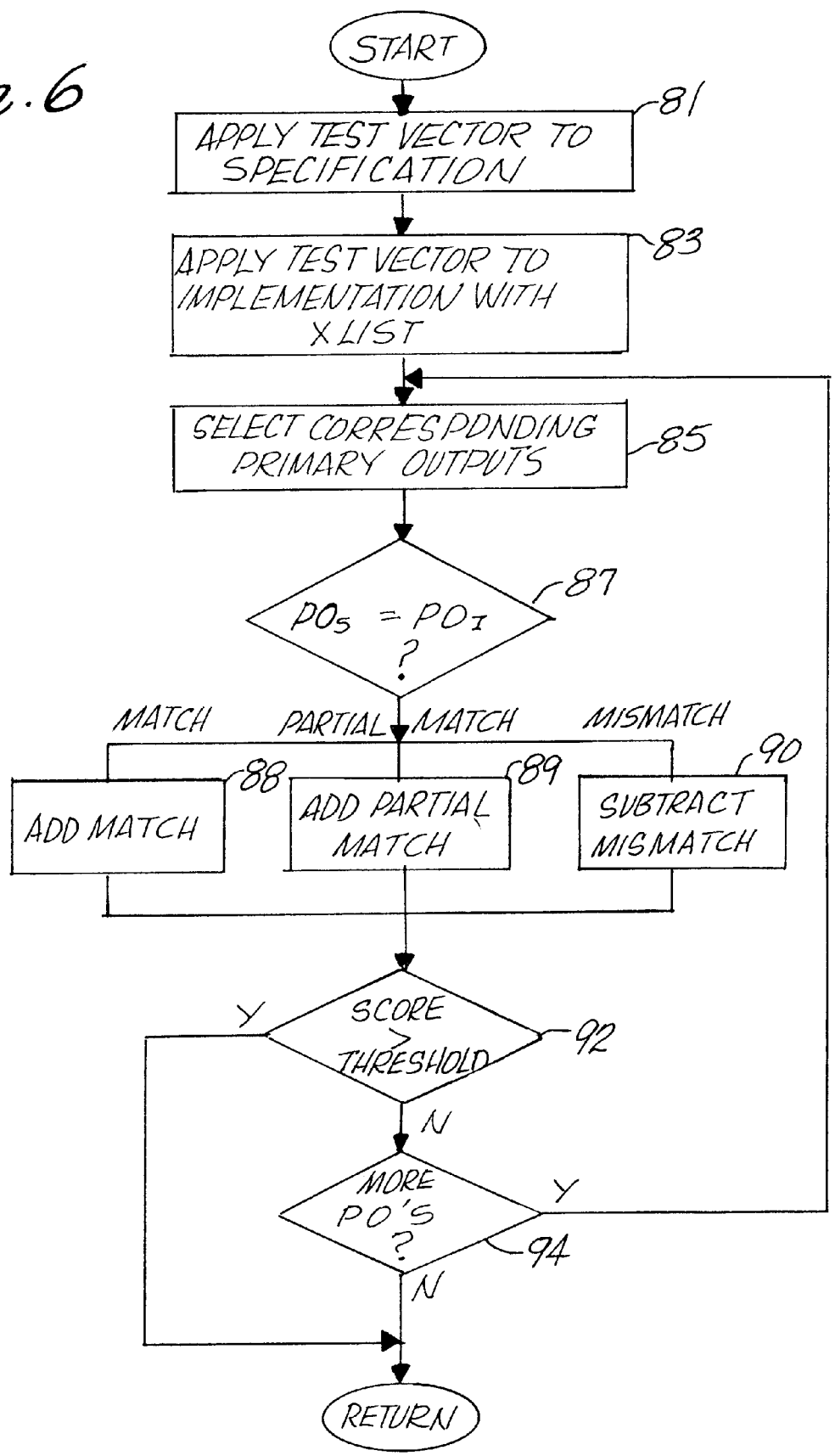
FIG. 6 illustrates a flow diagram of rank scoring of the candidate Xlists.

FIG. 6 illustrates a flow diagram of a process of evaluating a unit under test. In step 81, the process applies the test vector to the specification of the unit under test. In step 83 the process supplies the test vector to the faulty implementation, with the faulty implementation having an Xlist applied to it. In step 85, the process selects corresponding primary outputs from the specification and the faulty implementation. In step 87, the process compares the primary outputs selected from the specification with the corresponding primary output from the implementation. If the primary output of the specification is equal to the primary output of the implementation the process adds a match count to the Xlist score in step 88. A match between the primary output in the specification and the primary output of the implementation indicates that the primary output for the implementation is correct. If the primary output of the implementation is an x value and the primary output of the implementation partially matches the primary output of the specification, the process adds a partial match count to the Xlist score in step 89. If the primary output of the specification does not match the primary output of the implementation, or if the primary output of the specification being the inverse of the primary output of the implementation, then the process subtracts a mismatch count from the Xlist score in step 90.

In step 92, the process determines if the Xlist score is greater than some threshold value. If the Xlist score is greater than the threshold value then the process returns. Otherwise the process determines in step 94 whether all of the primary outputs have been examined. If additional primary outputs remain to be examined then the process returns to step 85. Otherwise the process returns.

Comparing the primary outputs of the computer-model circuit to the same computer-model circuit under the influence of an Xlist can also be used in the diagnostic process. The primary difference is that the definition of match changes. Referring again to FIG. 6, in steps 81 and 83, the comparison would be between the faulty implementation and the faulty implementation under the influence of Xlists. Therefore, instead of the specification, in step 81, being compared, it would be the faulty implementation responses. The definitions of match and mismatch would be reversed. A match would occur if a (0,1) or a (1,0) value combination and a mismatch would occur if a (0,0) or a (1,1) value combination occurred. However, since the only differences between the faulty implementation and the faulty implementation under the influence of Xlists are the Xlists, a match would not occur. A X value would not cause the faulty implementation to reverse its output response. At most the X value would cause the implementation to produce an output response of X.

The process can also be modified by reversing the values of match and mismatch and adding instead of subtracting a mismatch value to the score and subtracting instead of adding a match value to the score. In this case, the definitions of match and mismatch do not need to be changed. Therefore, there are multiple variations to the process shown in FIG. 6 to score the Xlist candidates such as using the comparison of the faulty implementation to the faulty implementation under the influence of an Xlist, the comparison of the specification to the faulty implementation under the influence of an Xlist, and the comparison of the faulty implementation to the specification under the influence of an Xlist. However, each variation in the process emphasizes one main diagnostic inference that a match or mismatch in the comparison represents that no combination of multiple errors consisting entirely of the nodes in the Xlist can account for the error in the circuit. As a result, this Xlist will receive a low score relative to the rest of the Xlists.

B. Fault Diagnosis

Fault diagnosis is invoked when a fault has been discovered at the fabrication or manufacturing stage of the design flow. The diagnostic process determines the error by comparing the primary output responses of a computer-representation of the circuit influenced by Xlists to the primary output responses of the faulty circuit. At the manufacturing stage, the primary output responses of the computer-representation of the circuit matches that of the specification, an error free circuit. The faulty circuit is the physical chip created from the circuit design. The faulty circuit contains a fault or multiple faults.

As with the error diagnosis, the computer-representation of the circuit is a computer model describing the circuit by using a hardware description language or by another similar means. The responses of the primary outputs of the computer-model circuit are determined by a simulation tool stimulating the primary inputs of the computer-model circuit, propagating logic values through the circuit, and examining the primary outputs of the circuit. The simulation tool also provides the replacement of values at nodes to an X value. Therefore, comparison of the primary outputs of the faulty circuit and the computer-representation of the circuit under the influence of an Xlist can be easily implemented by a computer. As applying an Xlist to an actual physical circuit presents difficulties the Xlist is instead applied to the design. Otherwise the fault diagnosis method is similar to the error diagnosis algorithm.

In the alternative, the primary output responses of the specification can be compared to the primary output responses of the faulty circuit under influence of Xlists. The implementation, is similar to the previous implementation of the comparison of the primary output responses of the computer-representation of the circuit influenced by Xlists to the primary output responses of the faulty circuit.

The match count, partial match count and mismatch penalty in steps 88, 89, and 90 of FIG. 6 represent input parameters. Assigning values to the three input parameters provides the diagnosis process with a measurement of the confidence in the error models. Assigning the match count and mismatch penalty to large values signifies to the diagnosis process that high confidence is associated with the given error models. Alternatively, assigning small values to the match count and mismatch penalty parameters signifies that low confidence is associated to the error models. High confidence in the error models means that the errors in the circuit are captured by the error models. Low confidence in the error models means that the types of errors in the circuit are uncertain.

The threshold limit in step 92 of FIG. 7 represents another input parameter. The threshold limit can be set to end the rank scoring of the Xlist once a mismatch has been encountered. The actual numerical value of the threshold limit can vary. However, if confidence is high in the models matching the errors, the threshold limit can be set to end once a mismatch occurs. This would provide a quicker traversal of the diagnostic process for that particular Xlist.

Furthermore, the threshold limit can be adjusted to allow more than one mismatch or other combinations of matches, partial matches, and mismatches. As long as the ranking score does not fall below the threshold limit, the rank scoring of the Xlist for the error or fault diagnoses as illustrated in FIG. 6 continues.

C. Using a Topologically Bounded Error Model in the Diagnostic Process based on Xlists If there exists multiple errors or faults topologically bounded by k, then by choosing overlapping Xlists as defined below, it can be guaranteed that the score of any Xlist containing all the nodes that are error sites would be the highest of any of the candidate Xlists.

$(1, 2, \ldots, 2_k)$ $(k+1, k+2, \ldots, 3_k)$ $(2_k+1, 2, \ldots, 4_k)$ $(3_k+1, 3_k+2, \ldots, 5_k)$

.

.

.

$(([n/2k]+1)k+1, \ldots, n)$

Considering any arbitrary topologically bounded error (i+1, . . . i+k), there is at least one Xlist that completely covers each node of the error. By setting the above-mentioned input parameters for the process guarantees that only mismatches are penalized. By the definition of Xlists, it is guaranteed that no mismatches would occur for any Xlist containing all the error nodes. If there exists an Xlist whose lowest node is less than or equal to i+1 and whose highest node is greater than or equal to i+k, then the Xlist containing all the error nodes has been found. If not, then there must exist an Xlist whose ending index must lie between i+1 and i+k. Then, the bounds on such an Xlist can be described by $[i+p-(2k-1), i+p]$, where $1 \leq p \leq k-1$ This implies, by our overlapping Xlist construction, there must exist another Xlist with bounds $[i+p-(k-1), i+p+k]$, where $1 \leq p \leq k-1$ This guarantees that this Xlist contains every node from the error chosen because:

$[i+p-(k-1), i+p+k]$, contains $[i+1, i+k]$ when $k \leq 2$, $1 \leq p \leq k-1$ D. Using a RTL-based Error Model in the Diagnostic Process Based on Xlists In a hierarchical design, a design or circuit is divided into high level modules. Within the high level modules are lower level modules. These lower level modules can contain further lower level modules and so forth. The behavior of lower level modules within a higher level module is captured by the higher level module.

However, due to the complexity of the circuitry in the lower level module, multiple errors or faults can be difficult to locate at lower levels of the design. By creating an Xlist which covers the outputs of a high level module, the erroneous behavior of the lower level modules are captured. If a lower level module contains errors, then it can be guaranteed that the score of RTL-based Xlist containing all the outputs of the higher level module in which the lower level module is contained would be the highest of any of the candidate Xlists.

Also, creating a set of Xlists to cover each high level module outputs will capture all the possible behaviors including the erroneous behavior of the lower level modules. Therefore, lower level modules not containing the error can be quickly removed from consideration to isolate the lower level module which contains the error.

E. Using a Cut-based Error Model in the Diagnostic Process Based on Xlists

A circuit or design can be divided to form a cut region. The cut region is a portion of the circuit in which input signals from any primary input of the circuit must pass through the cut region to reach any primary output of the circuit.

If a portion of the cut region or any region that is dominated by the cut region contains errors, then it can be guaranteed that the score of cut-based Xlist containing a subset of the nodes in the cut region would be the highest of any of the candidate Xlists if the error is within the subset of nodes.

Also, creating a set of Xlists to cover each cut region can be created to cover distinct subsets of the cut region and the set of Xlists together covering the entire cut region. Therefore, the set of Xlists can capture all the possible behavior including the erroneous behavior of the cut region.

F. Using a Region-based Error Model in the Diagnostic Process Based on Xlists

Assume that there exists multiple errors or faults such that there exists a node i and radius r in the circuit such that the distance of each of the nodes in the error set from node i is less than or equal to r. By choosing a region-based Xlist at each node in the circuit with a radius of r, it can be guaranteed that the Xlist centered at the node i would achieve the highest ranking score of all the Xlists.

By including all the error sites in at least one Xlist, it is possible to guarantee no mismatches for any Xlist that includes all the error nodes. Therefore, the Xlist centered at the node i would achieve the highest ranking score.

Therefore, exact diagnosis of errors is possible when the error being diagnosed is known to be of the model type. In this case, high confidence in the error model can be conveyed to the diagnostic process. Setting the input parameters to the following: match count=0; partial match count=0 and mismatch penalty=$\infty$ will convey a high confidence level to the diagnosis process. This will not only guarantee that the errors modeled by the error models will be found but it will also reduce the time needed to identify those errors.

However, if the given set of test vectors is inadequate, the possible number of Xlists with the highest ranking may be high from a practical perspective. In order to overcome this problem, the input parameters provide the flexibility to manipulate the diagnosis process based on the intuition that matches are better than mismatches and the practical approach to rank Xlists that do not provide mismatches higher than Xlists that do provide mismatches. The input parameters of match count of 10, partial match count of 5 and mismatch penalty of 1000 provide the diagnosis process with this intuitive and practical mix.

Furthermore, the specialized knowledge of engineers with knowledge of the unit under test may be utilized directly. The knowledge of the engineer or designer may be directly used by selecting the test vectors under the explicit guidance as the designer. The designer or engineer may select the test vector based on multiple criterions including circuit operation, known or highly probable defects in the design, or known or highly probable defects in the fabrication process. The test vectors selected are then presented to the primary inputs of the unit under test and thereby introduced into the system to locate multiple faults and errors based on Xlists. The test vectors may also be automatically generated by a automatic test tool.

Moreover, the knowledge of the engineer or designer may be directly used by setting the input parameters of the diagnosis process, match count, partial match count, mismatch penalty, and the threshold limit, as previously described.

III. An Example of Multiple Error and Fault Diagnosis

The process of FIGS. 5 and 6 is used below to determine fault locations of a faulty circuit illustrated in FIGS. 7*a–d* of FIG. 4, modified to include one additional fault. The faulty circuit of FIGS. 7a–d is the faulty circuit. The one additional fault is that the sixth NAND gate is instead an OR gate.

FIG. 7 illustrates the faulty circuit. As previously stated, the faulty circuit of FIG. 7a differs from the faulty circuit of FIG. 4 in that the sixth NAND gate has been replaced by an OR gate. Application of the two test vectors applied to the circuit of FIG. 4 also results in errors in the primary outputs of the circuit of FIG. 7a. Specifically, if a test vector V1 equal to 01111 is applied to the faulty circuit then first primary output of the circuit is set to 0 and the second primary output of the circuit is set to 1. As the circuit specification, as detailed in with respect to FIG. 3, requires the second primary output be a 0 when the first test vector V1 is applied to the circuit, the circuit of FIG. 7a is faulty. Application of the second test vector, V2, equal to 01000, results in the first primary output being set to 0 and the second primary output being set to 1. This is in accordance with the requirements of the specification as detailed in and with respect to FIG. 3.

Figure 7A:
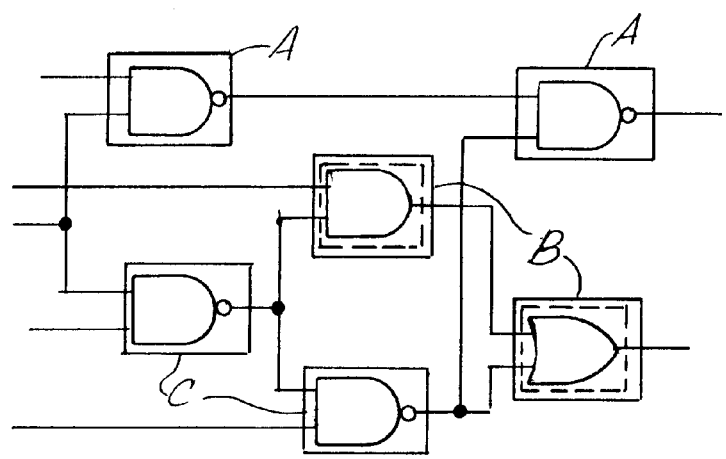
FIG. 7A illustrates a faulty circuit containing faults and Xlist A, Xlist B, and Xlist C.

Three Xlists are applied to the multi-circuit of FIG. 7a to determine possible error locations in the circuit. A first Xlist, Xlist A, is comprised of the nodes formed by the first NAND gate and the fifth NAND gate. A second Xlist, Xlist B, is comprised of the nodes formed by the AND gate and the OR gate. The third Xlist, Xlist C, comprises the nodes formed by the second NAND gate and the fourth NAND gate.

Figure 7B:
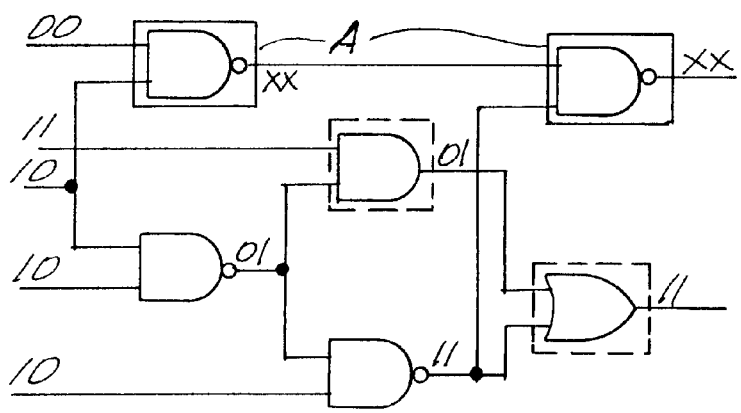
FIG. 7B illustrates a faulty circuit containing faults and Xlist A.

FIG. 7b illustrates application of the first and second test vectors to the faulty circuit with Xlist A. The Xlist results in the first primary output being set to X for both the first and second test vectors. The Xlist does not involve any nodes in the fan in of the second primary output. Accordingly, the outputs of the secondary primary output remain unchanged from the faulty circuit. Comparison of the primary outputs required of the circuit of FIG. 7b with primary outputs required by the specification for the first and second test vectors indicates that the first primary output partially matches the specification for both test vectors. This is because as X partially matches a 0 or a 1. A mismatch occurs, however, between the second primary output of the circuit of FIG. 7b with the second primary output required by the specification upon application of the first test vector V1. The second primary output does match the specification upon application of the second test vector V2. Accordingly, application of the first and second test vectors results in two partial matches, one mismatch, and one match. Assuming that a mismatch is valued at 1000, a partial match is valued at 5, and a match is valued at 10, the score provided Xlist A is negative 980.

Figure 7C:
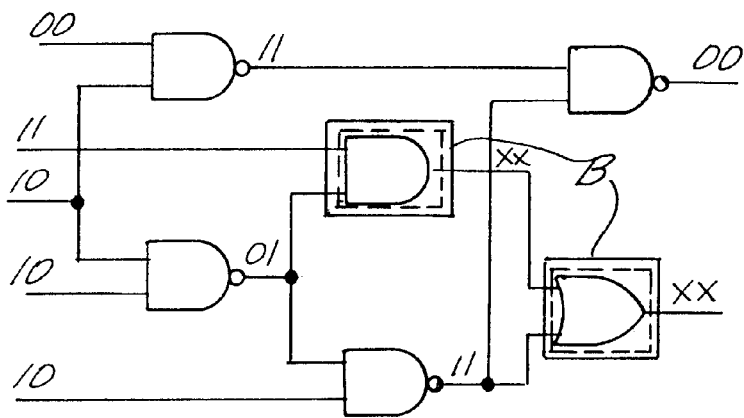
FIG. 7C illustrates a faulty circuit containing faults and Xlist B.

FIG. 7c illustrates faulty circuit of FIG. 7a with the second Xlist, Xlist B, applied to the circuit. Application of Xlist B to the faulty circuit does not have any effect on the first primary output as Xlist B lies entirely outside of the fan in of the first primary output. Xlist B contains, however, the gate which produces the second primary output. Thus, the second primary output will always be X when Xlist B is applied to the faulty circuit. Accordingly, the first primary output of the circuit in FIG. 7c will be 0 when either the first test vector or the second test vector is applied to the circuit. The second primary output of the circuit of FIG. 7c will be X when either the first or second test vector is applied to that circuit. The first primary outputs therefore match the specification response for both the first and second test vector, and the second primary output partially matches the specification for both the first and second test vector. Applying the same numerical value to matches, partial matches, and mismatches as used with respect to the circuit of FIG. 7b, Xlist B is given a score of 30.

Figure 7D:
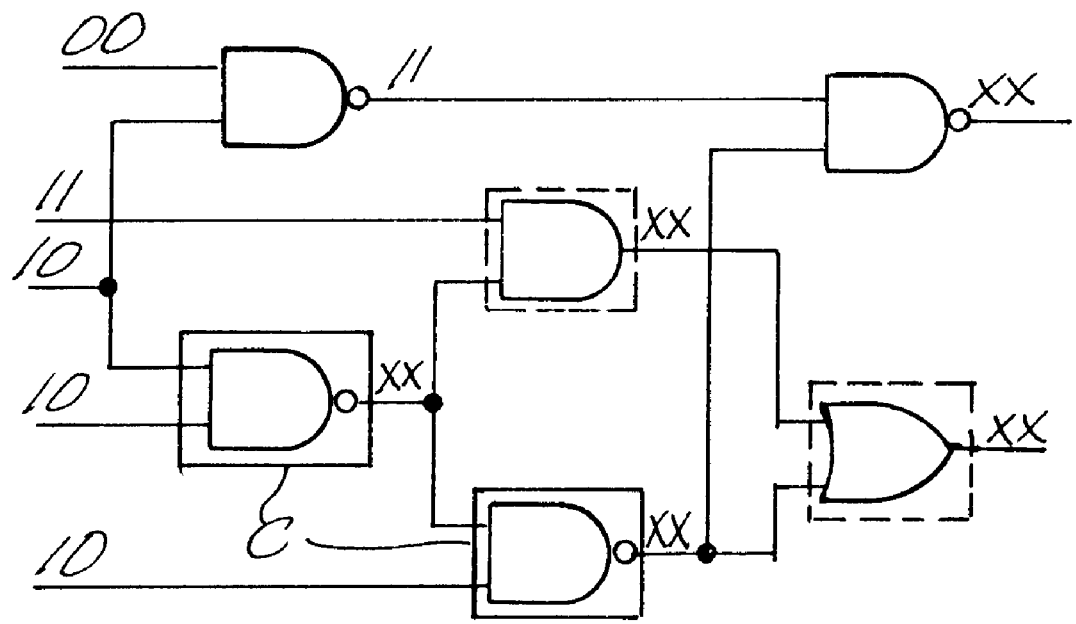
FIG. 7D illustrates a faulty circuit containing faults and a Xlist C.

FIG. 7d illustrates the faulty circuit of FIG. 7a with Xlist C applied to the faulty circuit. Application of the first test vector results in the output of the first NAND gate being set to 1, and the output of the fourth NAND gate being set to X due to application of Xlist C. Accordingly, the fifth NAND gate, which forms the signal corresponding to the first primary output, has a 1 and a X presented as inputs. As the output of a NAND gate is guaranteed to be 1 if any input to the NAND gate is 0, then the output of the fifth NAND gate is indefinite, i.e., X. Similarly, the output of the AND gate is 0 if either of the inputs to the AND gate are 0. Application of the first test vector results in the AND gate having a 1 and an X presented as inputs. Accordingly, output of the AND gate is X. Therefore the inputs to the OR gate are also X with the application of Xlist C. Use of the second test vector also results in a 1 and a X being presented as the inputs to the fifth NAND gate, and a X and a X being presented as inputs to the OR gate. Accordingly, the primary outputs of the circuit of 7d with Xlist C applied is always X. The primary outputs of the circuit of FIG. 7d therefore always partially match the specification upon application of the first or second test vector. Using the same values for match, partial match, and mismatch as used in the prior examples, Xlist C is given a score of 20.

TABLE III

| Xlist | Outputs | | Specification | Comparison | | Score |
|---|---|---|---|---|---|---|
| A | X | X | 0 | 0 | PM | PM | −980 |
|   | 1 | 1 | 0 | 1 | MM | M |   |
| B | 0 | 0 | 0 | 0 | M | M | 30 |
|   | X | X | 0 | 1 | PM | PM |   |
| C | X | X | 0 | 0 | PM | PM | 20 |
|   | X | X | 0 | 1 | PM | PM |   |

The results of the use of Xlist A, B and C in the faulty circuit of FIG. 7a are presented in Table III. Xlist B, which has the highest score, is ranked as most likely to contain all of the faulty nodes. Xlist C is ranked second, and Xlist A is indicated as clearly not being of interest. All of the errors in the faulty circuit are in Xlist B. Accordingly, the process correctly identifies the Xlist containing all of the faulty nodes as the most likely candidate. Additionally, the results also indicate the desirability of distinguishing between matches and partial matches.

IV. Improving Accuracy of the Diagnosis Process

With a set of sorted ranked Xlists, the ranked Xlists can be examined one by one to eliminate Xlists which do not contain all of the errors (or faults) in the design (or circuit). If the nodes of an Xlist contains all of the errors, then a correction can be made to the nodes of the Xlist to obtain the required circuit behavior. If no correction to those nodes can be made, however, then the Xlist must not have contained all of the errors.

Any test vector introduced at the primary inputs of a design propagates using simulation, through the design.

For any defined region in the design this propagation results in values being presented to the region. Further propagation results in the region outputting values, with further values propagating to the primary outputs.

For a set of test vectors which will generally be subsets of test vectors, each of which present the same distinct set of values to the inputs of the region. The region necessarily cannot produce different output values when presented the same input values. Accordingly, Xlists identifying a region in a design which, for proper circuit operation, would be required to produce different outputs for the same inputs cannot contain all of the errors expressed by a particular test vector.

In other words, by examining the inputs to a region defined by an Xlist, and by determining the outputs required of the region in order to meet design requirements, when a test vector is provided to a design, a correction function can be determined for the region such that the design meets design requirements.

However, if a test vector is found that produces the same set of input values to the region but requires a region outputs different from the outputs used to determine the correction function, then no correction function can be created for the region defined by the Xlist. As a result, all of the errors cannot be contained in the Xlist region because no changes solely within the Xlist region can produce the required primary output behavior.

Table IV provides a process for eliminating Xlists from consideration and forming correction functions. The process is provided a plurality of Xlists and test vectors. The process creates a correction function, $X_k OpsStSpecEqImplForVecSet_{km}$ for a particular test vector set of m test vectors for the $k^{th}$ Xlist. The process also creates a correction function, $X_k OpsStSpecEqImplForVec_{vj}$, for the $j_{th}$ test vector of the test vector set V for the $k^{th}$ Xlist. The correction function, $X_k OpsStSpecEqImplForVec_{vj}$, is constructed using binary decision diagrams (BDDs), such that $B_{ijk}$ is a BDD built for the $i^{th}$ primary output of a faulty circuit for the $j^{th}$ test vector for the $k^{th}$ Xlist. Methods for building BDD's are well known in the art, and are described, for example, in R. E. Bryant, *Graph-Based Algorithms For Boolean Function Manipulation*, IEEE Trans. Computer C-35(8): 667–691, August 1986, the disclosure of which is herein incorporated by reference.

Both of the correction functions store the output values of the Xlist, $X_k$, such that the primary outputs of a specification circuit and the faulty circuit are consistent for $j^{th}$ test vector, $V_j$. By testing the validity of the correcting functions $X_k OpsStSpecEqImpForVec_{vj}$ and $X_k OpsStSpecEqImpForVecSet_{km}$ for the $k^{th}$ Xlist, the Xlist is eliminated or not eliminated from consideration. The correction function is considered to be valid if a relationship can be drawn between the Xlist inputs to the Xlist outputs such that the Xlist outputs cause the primary outputs of the circuit to conform to the primary outputs of the specification circuit upon application of a test vector.

TABLE IV

```
for each xlist, X_k
    for each set of vectors (set number m) that produces
    distinct values at the inputs of X_k,
        Initialize
        X_k OpsStSpecEqImplForVecSet_km=ONE;
    end for;
    for each vector, v_j ∈ V
        X_k OpsStSpecEqImplForVec_vj=ONE;
        Simulate the error circuit with v_j,
        Assign BDD variables at the outputs of xlist X_K,
        Build BDDs B_ijk, for each PO i
        Simulate the good circuit;
        for each primary output in the good circuit, o_i
            if (o_i==0)
                X_k OpsStSpecEqImplForVec_vj=
                X_k OpsStSpecEqImplForVec_vj &&B̄_ijk
            else if(o_i==1)
                X_k OpsStSpecEqImplForVec_vj=
                X_k OpsStSpecEqImplForVec_vj &&B_ijk
            end if;
```

TABLE IV-continued

```
        end for;
        if (X_k OpsStSpecEqImplForVec_vj==NULL)
            //thresholds and scores may also be used here
            printf "Drop Xlist";
            go to next xlist;
        else
            X_k OpsStSpecEqImplForVecSet_km=
            X_k OpsStSpecEqImplForVecSet_km &&
            X_k OpsStSpecEqImplForVec_vj where vj ∈ Vkm;
            if(X_k OpsStSpecEqImplForVecSet_km==NULL
            //thresholds and scores may also be used here
                printf "Drop xlist";
                go to next xlist;
            end if;
        end if;
    end for;
    //thresholds and scores may also be used here
    printf "Probable Candidate";
end for;
```

Figure 8:
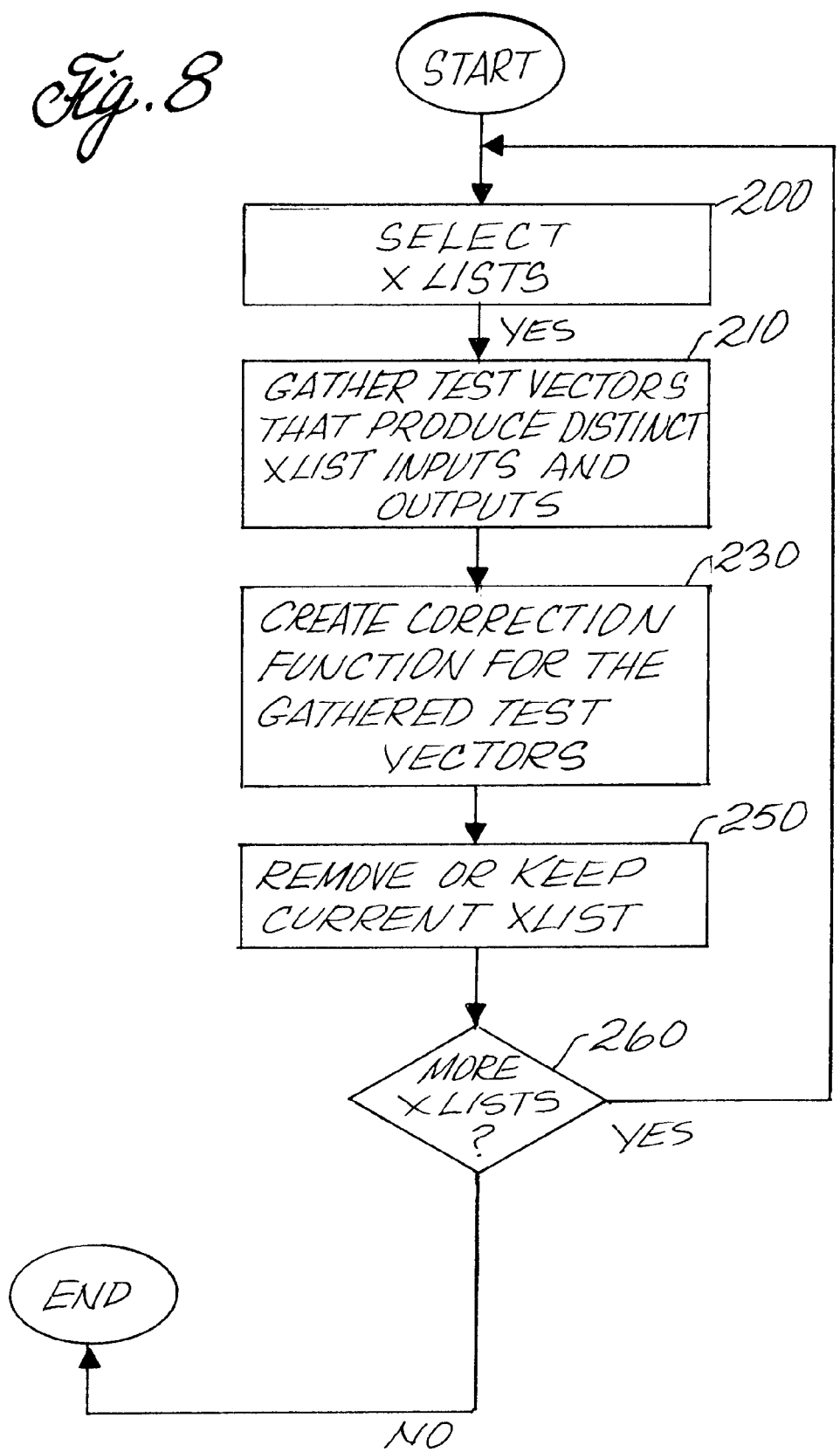
FIG. 8 illustrates a flow diagram of an overview of the process for improving the accuracy of the diagnosis process.

FIG. 8 illustrates a flow diagram of a process for eliminating Xlists which do not contain all of the errors of a design. The process assumes that the process of ranking the Xlists has been performed, although the process described in FIG. 8 may be performed without providing such a ranking. In step 200, an Xlist from the list of Xlists is selected. In step 210, test vectors that produce distinct inputs to the region defined by the Xlist are determined. The inputs to the Xlist region can be determined by simulation or other methods known in the art, such as building BDDs for the Xlist inputs in terms of the primary inputs, whose values are defined by the test vectors. In step 230, a correction function is created for each set of test vectors gathered in step 210. In step 250, the process determines if the Xlist cannot contain all of the expressed errors. In step 260, the process determines if more Xlists remain to be examined. If additional Xlists require examination, then steps 200, 210, 230, and 250 are repeated. Otherwise the process ends.

Figure 9:
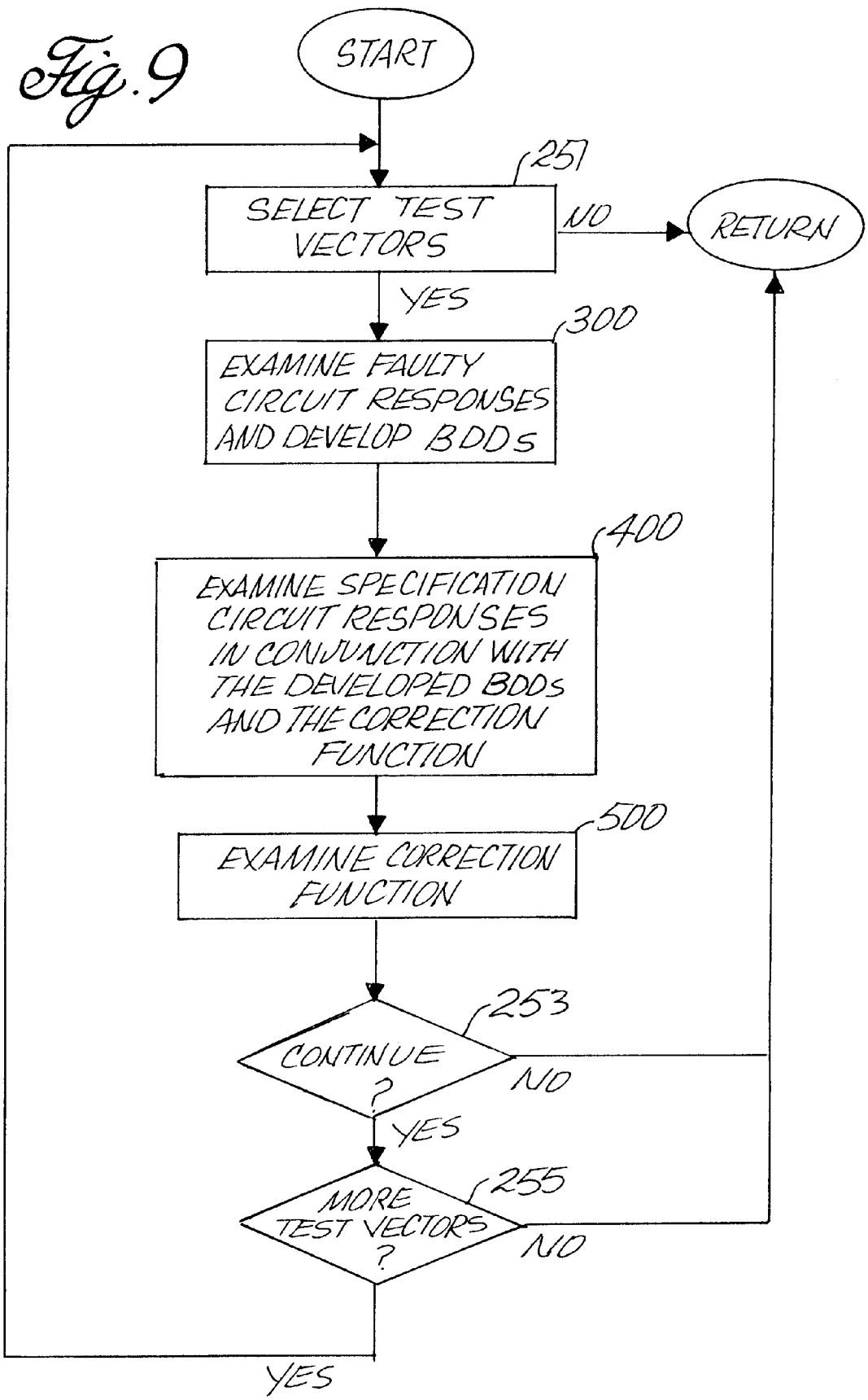
FIG. 9 illustrates a flow diagram of an overview of the process for eliminating Xlists which contains no errors or faults.

FIG. 9 illustrates a flow diagram of the detailed steps of step 250 of FIG. 8. In step 251, the process selects a test vector. In step 300, the process simulates the faulty design using the selected test vector, and builds BDDs for each primary output of the faulty circuit. The BDDs express the primary outputs solely in terms of the outputs of the Xlist region as the primary inputs are of known states due to the selected test vectors. The BDDs, therefore, correlate the primary outputs to the Xlist region outputs. Other ways of performing such a correlation are known and could also be used.

In step 400, using the selected test vector, the process simulates a design conforming to the specification. The primary output responses are examined and, using the developed BDDs of step 300, a new correction function is created. Of course, methods other than simulating the conforming design can be performed to determine correct primary output responses for a given test vector.

In step 500, the process tests the new correction function to ensure that the new correction function is valid. If the new correction function is valid, as checked in step 253, the process continues. Otherwise the process returns to begin processing another Xlist. In step 255, if another test vector needs to be examined, the next test vector is selected in step 251 and steps 300, 400, 500, 253 and 255 are repeated. If all test vectors have been examined, the process returns to begin processing another Xlist.

Figure 10:
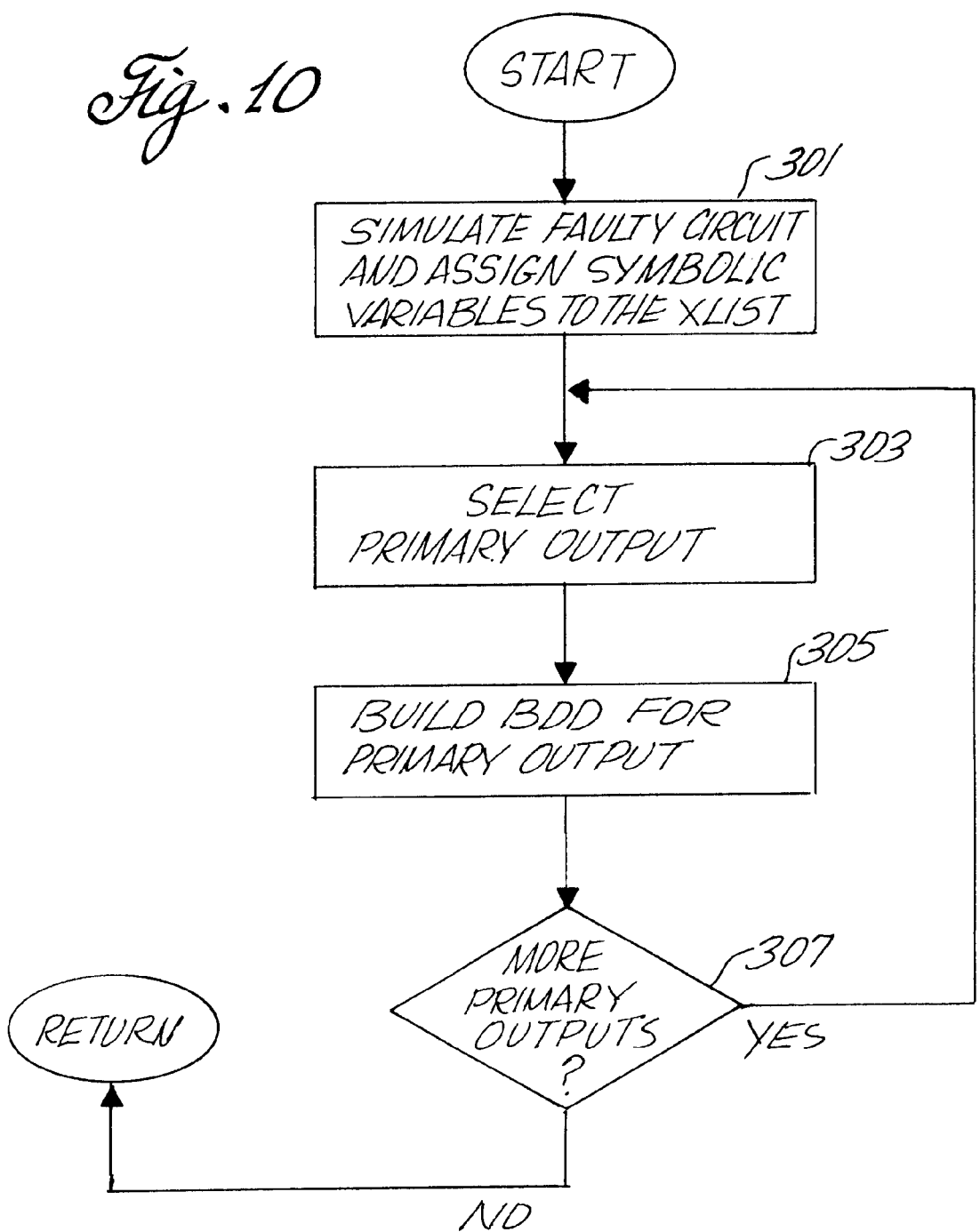
FIG. 10 illustrates a flow diagram of the detailed steps of step 300 of FIG. 9.

FIG. 10 illustrates a flow diagram of the detailed steps of step 300 of FIG. 9, which creates BDDs for each primary output of the faulty circuit for the selected test vector. In step 301 of FIG. 10, the process simulates the faulty design. In the faulty design, the selected Xlist region outputs are assigned symbolic variables. The process selects a primary output of the circuit in step 303. In step 305, the process builds a BDD for the selected primary output. As the primary inputs are known for the selected test vector, the BDD is in terms of the symbolic variables. In step 307, the process determines if additional primary outputs need to be examined. If additional primary outputs remain to be examined then the next primary output is selected in step 303 and steps 305 and 307 are repeated. If all the primary outputs have been examined the process returns to start step 400 of FIG. 9.

Figure 11:
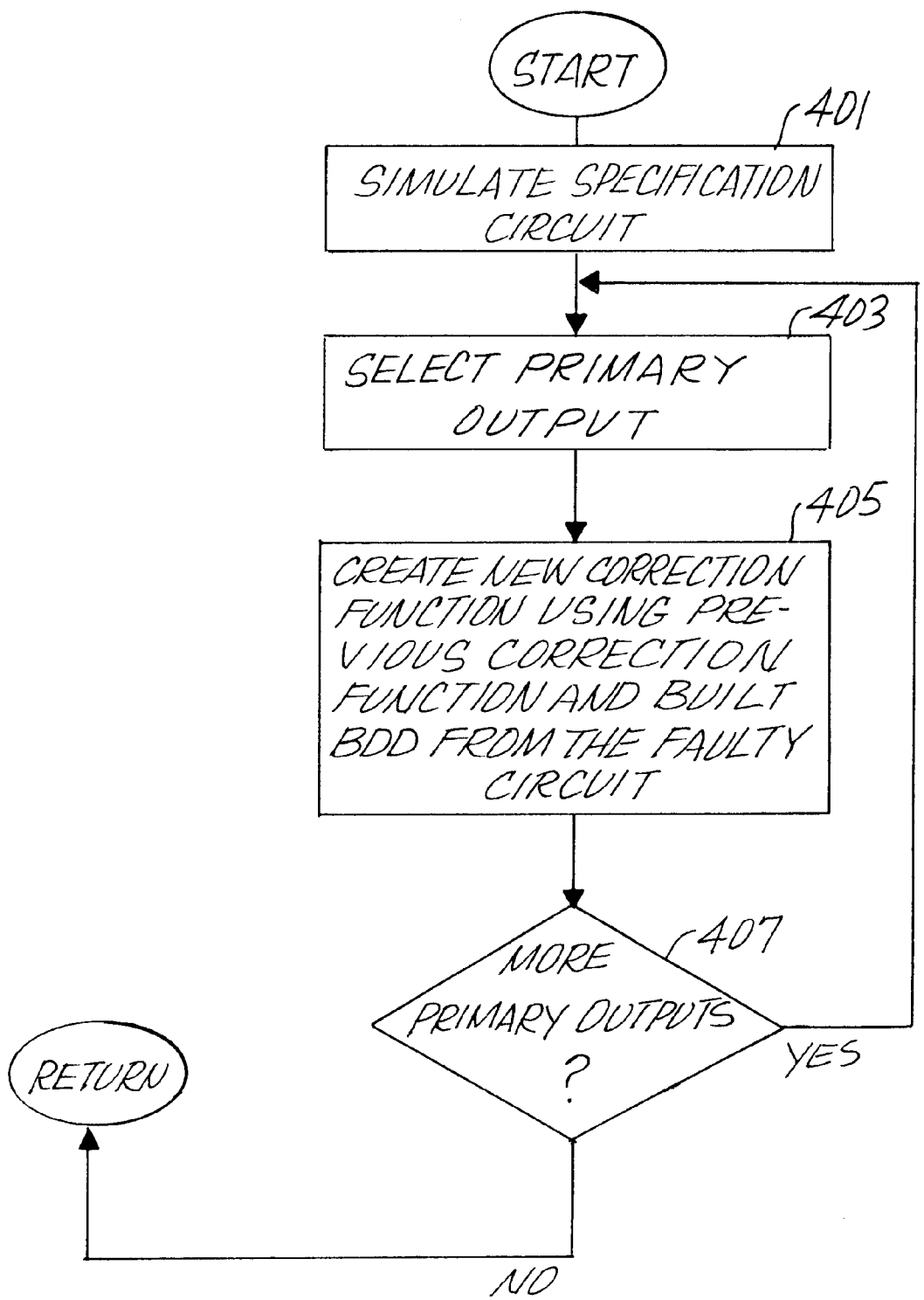
FIG. 11 illustrates a flow diagram of the detailed steps of step 400 of FIG. 9.

FIG. 11 illustrates a flow diagram of the detailed steps of step 400 of the process of FIG. 9. In step 400 of the process of FIG. 9 a new correction function is created. In step 401 of FIG. 11 a design conforming to the specification circuit is simulated. The process selects a primary output of the circuit in step 403. In step 405, a new correction function is created using the BDD previously build. If a correction function already exists, then the new correction function is created from the previous correction function and the BDD constructed in step 305 of FIG. 10. In step 407, if all the primary outputs have been examined the subprocess returns to start step 500 of FIG. 9. In step 407, if more primary outputs need to be examined, steps 403, 405 and 407 are repeated.

Figure 12:
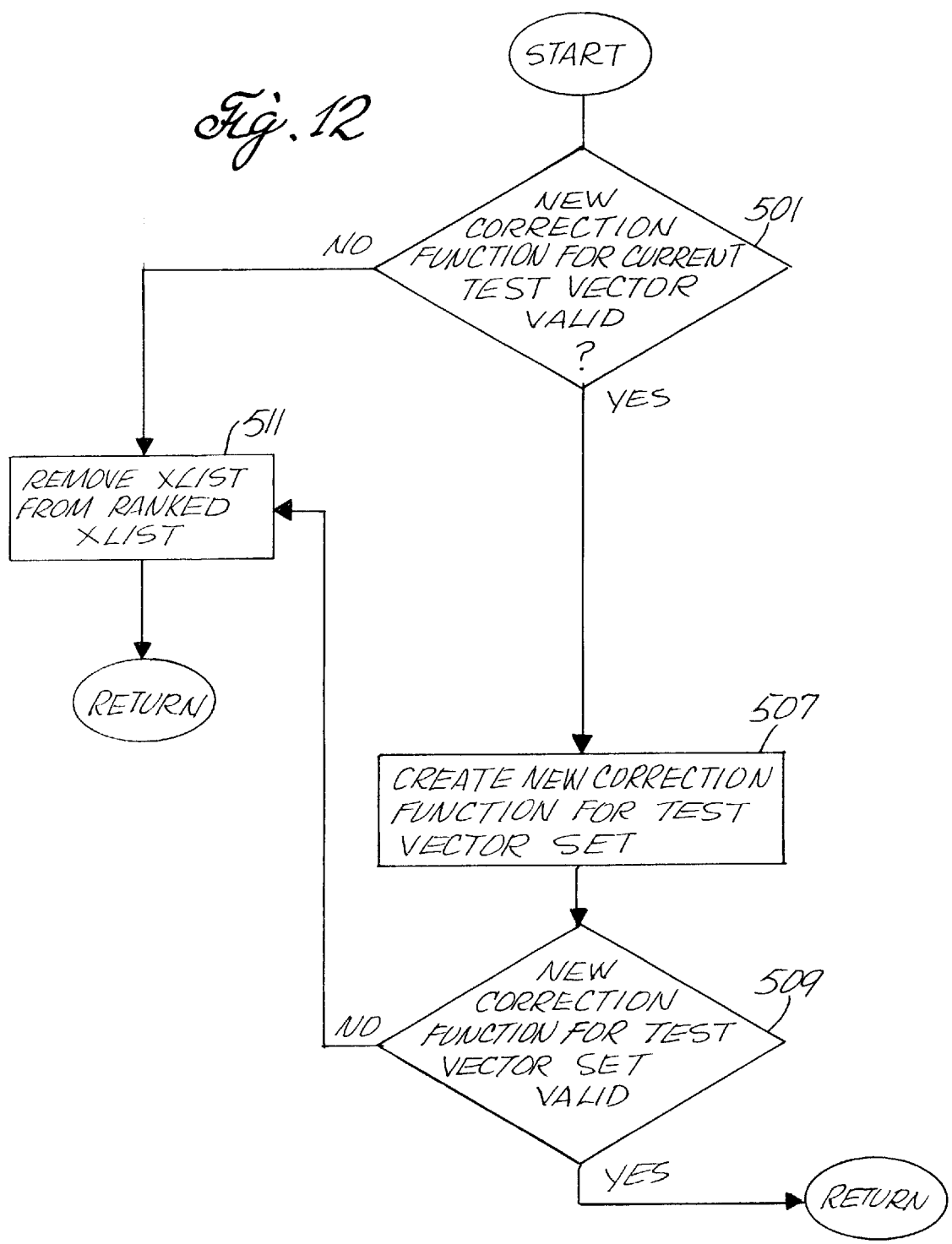
FIG. 12 illustrates a flow diagram of the detailed steps of step 500 of FIG. 9.

FIG. 12 illustrates a flow diagram of the detailed steps of step 500 of FIG. 9. Step 500 of the process of FIG. 9 determines if the correcting function is valid. The correction function for the current test vector created in step 400 of FIG. 9 is examined in step 501 of FIG. 12. If the correction function is valid, i.e. corrects the errors/faults in the nodes of the Xlist, the process continues. If the correction function is invalid, i.e. does not correct the errors/faults in the nodes of the Xlist, the Xlist is removed from the ranked list of Xlist in step 511 and the process returns to start step 253 of FIG. 9.

Previously in step 230 of FIG. 8, the correction function for the test vector set was determined. The new correction function for the test vector set is created in step 507 by manipulating the previous correction function created in step 230 and the correction function for the current test vector created in step 400 of FIG. 9. The new correction function is reduced or expanded to include the additional requirements presented by the current test vector. In step 509, the new correction function for the test vector set is examined for validity. If the new correction function for the test vector set is valid, i.e. corrects the errors/faults in the nodes of the Xlist for the test vector set, then step 500 of FIG. 9 is complete and the next test vector is selected in step 251 of FIG. 9. If the new correction function for the test vector set is invalid, then the Xlist is removed from the set of ranked Xlists in step 511 and step 500 of FIG. 9 is done and the next Xlist is selected in step 200 of FIG. 8.

A. Alternative Diagnosis Process

The diagnosis process is not limited by the use of a three valued logic simulation. Explicit three valued simulation can be replaced with three valued symbolic simulation. In one embodiment, BDDs with three terminals (0,1,X) are used. Use and construction of three terminal BDDs are known in the art see, e.g., Ross, *Functional calculations using Ordered Partial Multi-Decision Diagrams*, Ph.D Dissertation, Dept. of Electrical and Computer Engineering, University of Texas at Austin, 1990, the disclosure of which is herein incorporated by reference. A similar BDD for logic minimization has been introduced in Matsunaga, Fujita, and Kakuda, Multi-level logic minimization across latch boundaries, ICCAD, 1990, the disclosure of which is herein incorporated by reference. Several other types of decision diagrams to implement three valued symbolic simulation are possible, such as Multiple Terminal decision diagrams (MTDD), Algebraic decision diagrams (ADD), and Semi-Numeric decision diagrams (SNDD).

BDDs with X values can be used in multiple ways. In one embodiment, for each gate assigned a X value, a dummy variable XV is introduced. All manipulation with respect to XV will act as logic manipulations between functions and a X value. XV can be placed at the bottom of the order list, and later when the BDD construction is completed, it can be replaced by a terminal X.

Also, decision diagrams can be used where each node has three outgoing edges, 0, 1, X. Either each variable in the BDD is represented as a node with 3 outgoing edges or only the nodes which are assigned a X value are treated in this manner. The above discussion illustrates that many such embodiments are possible where a decision diagram is used in which values other than Boolean values (0, 1), such as X, are used during function manipulation.

Utilizing the same ranking procedures for the three valued logic simulation as illustrated in FIGS. 5 and 6, Xlists can be ranked using the three valued symbolic simulation. The primary output responses of the circuit representations, i.e. a faulty circuit and a circuit specification, are compared by testing the equivalence of, XORing, the BDDs generated for a test vector for each circuit representation. As a result, by applying a plurality of test vectors, matching, partial matching, and mismatching scoring is determined by counting the number of test vectors that reach terminal 0, terminal 1, and terminal X. Therefore, as with the three valued logic simulation, ranks can be assigned to the Xlists.

Figure 13:
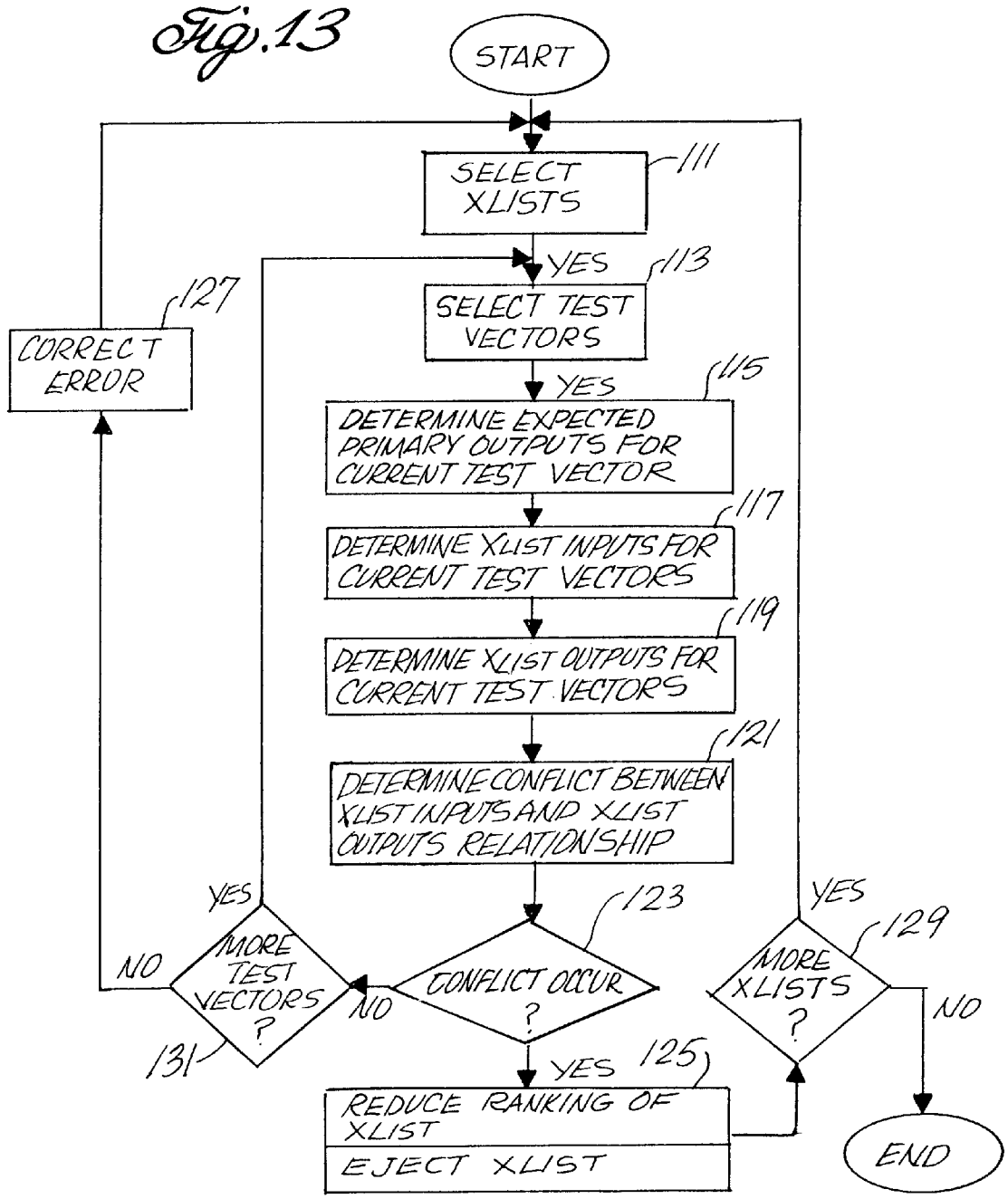
FIG. 13 illustrates a flow diagram of another implementation for eliminating Xlists which contain no errors or faults.
Figure 14:
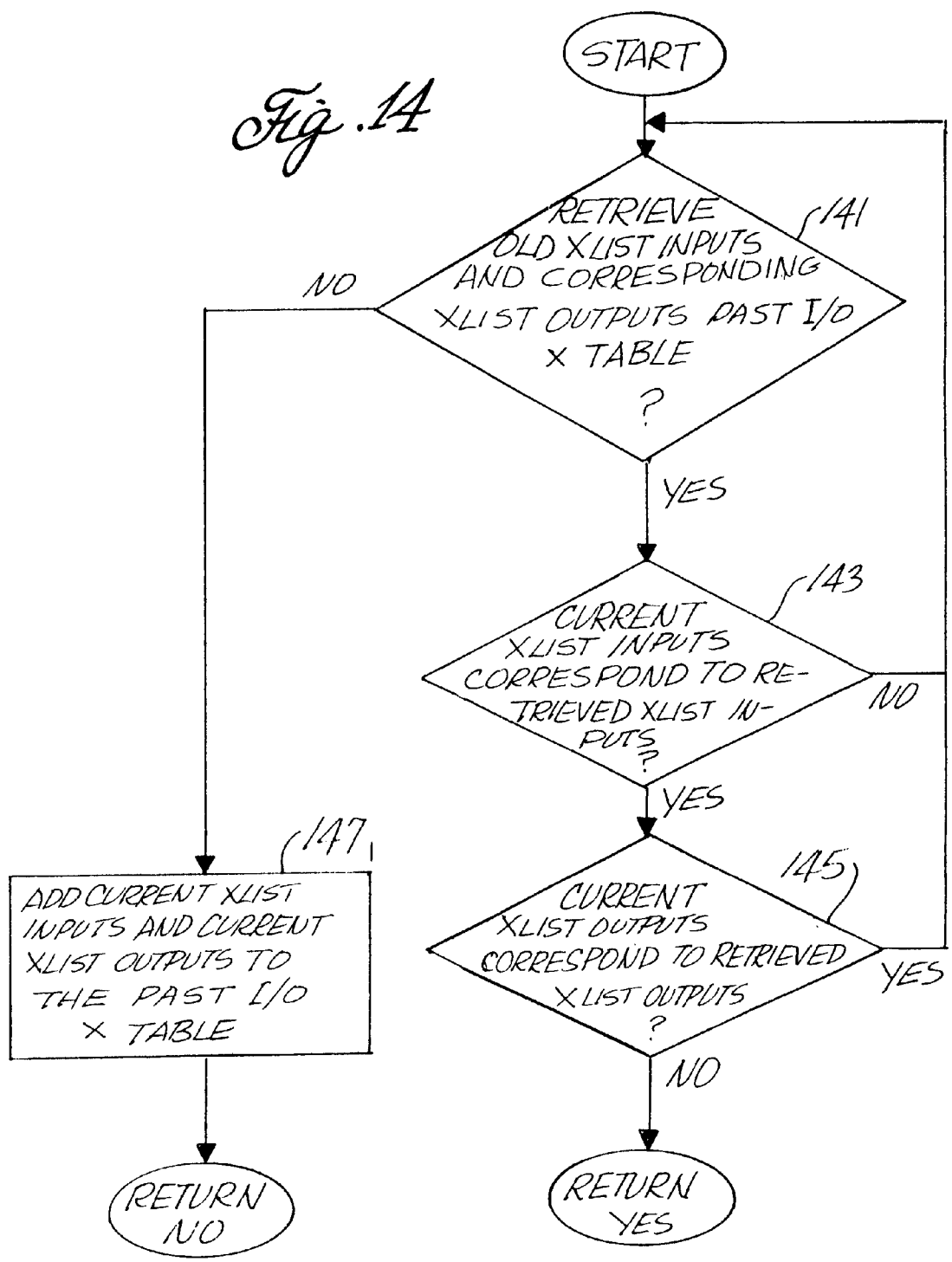
FIG. 14 illustrates a flow diagram of the detailed steps of step 121 of FIG. 13.

FIGS. 13 and 14 illustrate flow diagrams of an alternative implementation of the process of eliminating Xlists which are not sources of errors/faults.

FIG. 13 illustrates a flow diagram of the alternative process. The process selects an Xlist in step 111. In step 113 the process selects a test vector. The test vector is applied to the primary inputs of the circuit under the influence of the Xlist. The test vector is propagated through the circuit to the primary outputs of the circuit through a computer simulation similar to the simulation used in the diagnosis processes previously described. In step 115, a primary output for the test vector is determined by examining the specification. As previously discussed, the specification describes the behavior of the circuit and as such the specification determines that a given set of test vectors introduced at the primary inputs of the circuit produce corresponding expected primary outputs. In step 117, the inputs to the Xlist are determined by examining the simulation results. The outputs to the Xlist is also determined in step 119. The Xlist outputs can be determined by examining the simulation results or by using BDDs. In step 121, the conflict relationship between the inputs to the Xlist and the outputs of the Xlist is examined for the current test vector and previously examined test vectors.

FIG. 14 illustrates a flow diagram that elaborates on the determination of the relationship of the Xlist inputs to the Xlist outputs. In step 141 of FIG. 14, the previous Xlist inputs and Xlist outputs produced by previous test vectors for the current Xlist are retrieved one by one from a storage means, i.e., a past I/O X table. If there are no previous Xlist inputs or outputs to examine in step 141, then the current Xlist input and output are stored, i.e., added to the past I/O X table, in step 147. After step 147, a "no" response is produced for step 121 of FIG. 13, relating that a conflict has not occurred between the Xlist inputs and outputs from the current test vector and the Xlist inputs and outputs from the previous test vectors. If there are previous Xlist inputs and outputs, step 143 is invoked and the current Xlist inputs are compared with the previous Xlist inputs. If the current Xlist inputs do not correspond to the previous Xlist inputs, then the next set of previous Xlist inputs and outputs are retrieved in step 141. However, if the current Xlist inputs do correspond to the previous Xlist inputs, then in step 145, the current Xlist outputs are compared with the previous Xlist outputs.

If in step 145, the current Xlist outputs do correspond to the previous Xlist output, then the next set of previous Xlist inputs and outputs are retrieved in step 141. If the current Xlist outputs do not correspond to the previous Xlist outputs in step 141, then a "yes" response is produced for step 121 of FIG. 13. As a result, a conflict has occurred between the Xlist inputs and outputs produced by the current test vector and the Xlist inputs and outputs produced by the previous test vectors.

In step 123 of FIG. 13, the response from step 121 and essentially from the process in FIG. 14, is tested. If a conflict has been identified, then step 125 modifies the ranked Xlists. The ranking of the current Xlist can be reduced or the current Xlist can be removed from the ranked Xlists. A conflict occurring shows that regardless of the changes made to the Xlist, the expected primary outputs will not be produced with the given set of test vectors as defined by the specification. Therefore, the error/fault does not exist in the Xlist. After modifying the ranked Xlists, the process is started over in step 111 with another Xlist as determined in step 129. If no more Xlists exists as determined in step 129, then the process is at an end.

However, if a conflict has not occurred, then more test vectors are examined as determined in step 131 and are presented to the primary inputs of the circuit containing the Xlist. Steps 113, 115, 117, 119, 121, and 123 are repeated to determine the relationship between the Xlist inputs and outputs produced by the current test vector and the Xlist inputs and outputs produced by the previous test vectors. If no more test vectors are available as determined in step 131, then in step 127, a correcting means is used to fix the error within the given Xlist. The correcting means could be a determined using a BDD, given that the inputs to the Xlist from step 117 and the outputs to the Xlist from step 119 are known. Using a BDD, a boolean function can be created. With the boolean function, a computer can generate a set of gates which represents the boolean function to replace the gates in the Xlist. In step 127, other conventional methods to correct the error can be used then previously described.

Accordingly, the present invention provides a system and methodology for multiple error and fault diagnostic developed from a non-enumerative analysis technique based on three value logic simulation and symbolic logic simulation and error models addressing the locality aspect of an error location. Although this invention has been described in certain specific embodiments, many additional modifications and variations would be apparent to one skilled in the art. It is therefore to be understood that this invention may be practiced otherwise than is specifically described. Thus, the present embodiments of the invention should be considered in all respects as illustrative and not restrictive. The scope of the invention to be indicated by the appended claims rather than the foregoing description.

What is claimed is:

1. A computer-implemented method of locating multiple errors and faults without explicitly considering each possible multiple error or fault within a circuit, the circuit having a set of primary inputs and outputs and a set of logic components interconnected by nodes, comprising:

propagating logic values from the primary inputs through the circuit to the primary outputs;

replacing logic values at a set of nodes by a value of X during the simulation of the propagation of the primary inputs, X being a logic value of a three value logic system;

propagating the X values to subsequent logic components by a 3-valued logic simulation;

ranking candidates nodes;

drawing diagnostic inferences from the candidates of nodes;

identifying a match to be a logic combination of an expected primary output response of logic 0 with an actual primary output response of logic 0 or an expected primary output response of logic 1 with an actual primary output response of logic 1;

identifying a partial match to be a logic combination of an expected primary output response of logic 0 with an actual primary output response of X or an expected primary output response of logic 1 with an actual primary output response of X; and identifying a mismatch to be a logic combination of an expected primary output response of logic 0 with an actual primary output response of logic 1 or an expected primary output response of logic 1 with an actual primary output response of logic 0.

2. The method of claim 1, wherein the ranking the candidate nodes comprises:

covering all the errors or faults in the circuit in terms of logic values; and a candidate nodes containing all the errors and faults is ranked the highest out of the other candidate nodes.

3. The method of claim 1, wherein ranking the candidates of nodes comprises:

examining each candidate nodes for each stimuli at the primary inputs;

examining each primary output for each candidate of nodes; and recording matches, partial matches, and mismatches of the responses at the primary outputs to the expected responses at the primary outputs of the circuit without errors and faults.

4. A computer system of locating multiple errors and faults without explicitly considering each possible multiple error or fault within a circuit, the circuit having a set of primary inputs and outputs and a set of logic components interconnected by nodes, comprising:

means for covering errors or faults in terms of logic values;

means for specifying the expected responses at the primary outputs of the circuit without errors and faults;

means for presenting a stimuli to the primary inputs of the circuit;

means for representing in terms of logic values the propagation of the primary inputs through the circuit to the primary outputs;

means for replacing logic values at a set of nodes by a value of X during the simulation of the propagation of the primary inputs, X being a logic value of a three value logic system;

means for propagating the X values to subsequent logic components by a 3-valued logic simulation, means for ranking candidates of nodes;

means for locating errors and faults from the ranked candidates of nodes;

means for identifying a match to be a logic combination of an expected primary output response of logic 0 with an actual primary output response of logic 0 or an expected primary output response of logic 1 with an actual primary output response of logic 1;

means for identifying a partial match to be a logic combination of an expected primary output response of logic 0 with an actual primary output response of X or an expected primary output response of logic 1 with an actual primary output response of X; and means for identifying a mismatch to be a logic combination of an expected primary output response of logic 0 with an actual primary output response of logic 1 or an expected primary output response of logic 1 with an actual primary output response of logic 0.

5. The system of claim 4, wherein the means for covering errors or faults in terms of logic values comprises:

a topologically bounded error model where the error is bounded by an upper and lower value; and means for choosing a set of nodes based on the topologically bounded error model.

6. The system of claim 4, wherein the means for covering errors or faults in terms of logic values comprises:

a cut based error model where the error is within a cut region, the cut region in which input signals from any primary input of the circuit must pass through the region to reach any primary output of the circuit; and means for choosing a set of nodes based on the cut based error model.

7. The system of claim 4, wherein the means for covering errors or faults in terms of logic values comprises:

a region-based error model where the error is within a structural radius distance from a chosen node; and means for choosing a set of nodes based on the region-based error model.

8. The system of claim 4, wherein the means for covering errors or faults in terms of logic values comprises:

a register level based error model where the error is within the outputs of a module of a circuit, the circuit containing at least two hierarchical levels; and means for choosing a set of nodes based on the register level based error model.

9. The system of claim 4, wherein the means for covering errors or faults in terms of logic values comprises:

a error model used to describe a type of error.

10. The system of claim 4, wherein the means for covering errors or faults in terms of logic values comprises:

a fault model used to describe a type of fault.

11. The system of claim 4, wherein the means for covering errors or faults in terms of logic values comprises:

means for attributing a level of confidence in the modeling by using a plurality of parameters effecting the ranking of the candidates of nodes.

12. The system of claim 4, wherein the stimuli comprises a set of test vectors.

13. The system of claim 4, wherein the stimuli comprises a set of test vectors chosen by a designer of the circuit or automatically using a specified criteria.

14. The system of claim 4, wherein the means for representing in terms of logic values the propagation of the primary inputs through the circuit to the primary outputs comprises:

a software program that process the input stimuli provided to the primary inputs and determines the logic values throughout the circuit over a time period which may be specified by at least one clock.

* * * * *